(12) United States Patent
Tang et al.

(10) Patent No.: US 11,725,993 B2
(45) Date of Patent: Aug. 15, 2023

(54) FORCE-MEASURING AND TOUCH-SENSING INTEGRATED CIRCUIT DEVICE

(71) Applicant: UltraSense Systems, Inc., San Jose, CA (US)

(72) Inventors: Hao-Yen Tang, San Jose, CA (US); Sina Akhbari, San Jose, CA (US); Man-Chia Chen, Palo Alto, CA (US); Zhongxuan Tu, Shanghai (CN); Michael Chen, Sunnyvale, CA (US)

(73) Assignee: UltraSense Systems, Inc., San Jose, CA (US)

( * ) Notice: Subject to any disclaimer, the term of this patent is extended or adjusted under 35 U.S.C. 154(b) by 306 days.

(21) Appl. No.: 17/119,365

(22) Filed: Dec. 11, 2020

(65) Prior Publication Data

US 2021/0181041 A1 Jun. 17, 2021

Related U.S. Application Data

(60) Provisional application No. 63/048,914, filed on Jul. 7, 2020, provisional application No. 62/947,748, filed on Dec. 13, 2019.

(51) Int. Cl.
*H01L 41/113* (2006.01)
*G01L 1/16* (2006.01)
(Continued)

(52) U.S. Cl.
CPC .............. *G01L 1/16* (2013.01); *G01H 11/08* (2013.01); *H10N 30/10513* (2023.02);
(Continued)

(58) Field of Classification Search
CPC ........... B06B 1/06; B06B 1/0607; B06B 1/10; H10N 30/50; H10N 30/10513;
(Continued)

(56) References Cited

U.S. PATENT DOCUMENTS 4,412,544 A 11/1983 Beretsky et al.
8,676,540 B1 3/2014 Welch et al.
(Continued)

FOREIGN PATENT DOCUMENTS

WO WO2018077761 5/2018

*Primary Examiner* — Derek J Rosenau
(74) *Attorney, Agent, or Firm* — Perkins Coie LLP

(57) ABSTRACT

A force-measuring and touch-sensing integrated circuit device includes a semiconductor substrate, a thin-film piezoelectric stack overlying the semiconductor substrate, piezoelectric micromechanical force-measuring elements (PMFEs), and piezoelectric micromechanical ultrasonic transducers (PMUTs). The thin-film piezoelectric stack includes a piezoelectric layer. The PMFEs and PMUTs are located at respective lateral positions along the thin-film piezoelectric stack, such that each of the PMFEs and PMUTs includes a respective portion of the thin-film piezoelectric stack. Each PMUT has a cavity, the respective portion of the thin-film piezoelectric stack, and first and second PMUT electrodes. Each PMFE has the respective portion of the thin-film piezoelectric stack, and first and second PMFE electrodes. Each PMFE is configured to output voltage signals between the PMFE electrodes in accordance with a time-varying strain at the respective portion of the piezoelectric layer resulting from a low-frequency mechanical deformation.

57 Claims, 28 Drawing Sheets

(51) Int. Cl.
  *G01H 11/08* (2006.01)
  *H10N 30/50* (2023.01)
  *H10N 30/30* (2023.01)
  *H10N 30/87* (2023.01)
  *H10N 30/00* (2023.01)

(52) U.S. Cl.
  CPC ........... *H10N 30/302* (2023.02); *H10N 30/50* (2023.02); *H10N 30/875* (2023.02)

(58) Field of Classification Search
  CPC .............. H10N 30/875; H01L 41/0475; H01L 41/0805; H01L 41/083; H01L 41/1132
  USPC .......................................... 310/322, 334, 335
  See application file for complete search history.

(56) References Cited

U.S. PATENT DOCUMENTS

| | | | |
|---|---|---|---|
| 10,466,844 | B1 | 10/2019 | Tang et al. |
| 10,585,534 | B2 | 3/2020 | Tang et al. |
| 10,719,175 | B2 | 7/2020 | Akhbari et al. |
| 10,775,938 | B2 | 9/2020 | Tang et al. |
| 2001/0000666 | A1 | 5/2001 | Wood et al. |
| 2002/0005108 | A1 | 1/2002 | Ludwig |
| 2003/0144814 | A1 | 7/2003 | Hama et al. |
| 2003/0217873 | A1 | 11/2003 | Paradiso et al. |
| 2003/0233233 | A1 | 12/2003 | Hong |
| 2007/0260425 | A1 | 11/2007 | Kim |
| 2008/0316184 | A1 | 12/2008 | D'Souza |
| 2009/0157206 | A1 | 6/2009 | Weinberg et al. |
| 2009/0224161 | A1 | 9/2009 | Fritsch et al. |
| 2010/0117993 | A1 | 5/2010 | Kent |
| 2010/0139991 | A1 | 6/2010 | Phillip et al. |
| 2010/0258361 | A1 | 10/2010 | Yamauchi et al. |
| 2011/0061464 | A1 | 3/2011 | Yi-Min |
| 2012/0274609 | A1 | 11/2012 | Sheng et al. |
| 2013/0345864 | A1 | 12/2013 | Park et al. |
| 2014/0022189 | A1 | 1/2014 | Sheng et al. |
| 2014/0071095 | A1 | 3/2014 | Godsill |
| 2015/0148674 | A1 | 5/2015 | Park et al. |
| 2015/0169136 | A1 | 6/2015 | Ganti et al. |
| 2015/0265246 | A1* | 9/2015 | Nakamura ........... A61B 8/4427 600/459 |
| 2015/0273526 | A1* | 10/2015 | Tsuruno ............... A61B 8/4494 600/443 |
| 2016/0216794 | A1 | 7/2016 | Yoon et al. |
| 2016/0246449 | A1 | 8/2016 | Jarske |
| 2017/0110504 | A1 | 4/2017 | Panchawagh et al. |
| 2017/0255338 | A1 | 9/2017 | Medina |
| 2017/0322290 | A1 | 11/2017 | Ng et al. |
| 2017/0336903 | A1 | 11/2017 | Rivaud et al. |
| 2017/0336926 | A1 | 11/2017 | Chaudhri et al. |
| 2018/0032161 | A1 | 2/2018 | Shi et al. |
| 2018/0032211 | A1 | 2/2018 | King |
| 2018/0039392 | A1 | 2/2018 | Kim et al. |
| 2018/0164937 | A1 | 6/2018 | Lynn |
| 2018/0246612 | A1 | 8/2018 | Lynn et al. |
| 2018/0276439 | A1 | 9/2018 | Strohmann et al. |
| 2018/0276440 | A1 | 9/2018 | Strohmann et al. |
| 2018/0284892 | A1 | 10/2018 | Kwon et al. |
| 2018/0323783 | A1 | 11/2018 | Bang et al. |
| 2019/0050618 | A1 | 2/2019 | Khuri-Yakub |
| 2019/0074833 | A1 | 3/2019 | Sheng |
| 2019/0354209 | A1 | 11/2019 | Tang et al. |
| 2019/0354210 | A1 | 11/2019 | Akhbari et al. |
| 2019/0354237 | A1 | 11/2019 | Tang et al. |
| 2019/0354238 | A1 | 11/2019 | Akhbari et al. |
| 2021/0239553 | A1 | 8/2021 | Akhbari et al. |
| 2021/0242393 | A1 | 8/2021 | Tang |
| 2021/0278926 | A1 | 9/2021 | Akhbari et al. |
| 2021/0293641 | A1 | 9/2021 | Tu et al. |
| 2021/0293648 | A1 | 9/2021 | Tu et al. |

* cited by examiner

FORCE-MEASURING AND TOUCH-SENSING INTEGRATED CIRCUIT DEVICE

CROSS-REFERENCE TO RELATED APPLICATIONS

This application claims the benefit of U.S. Provisional Patent Application No. 62/947,748 filed on Dec. 13, 2019, entitled FORCE-MEASURING AND TOUCH-SENSING INTEGRATED CIRCUIT DEVICE, and U.S. Provisional Patent Application No. 63/048,914 filed on Jul. 7, 2020, entitled FORCE-MEASURING AND TOUCH-SENSING INTEGRATED CIRCUIT DEVICE, which are incorporated herein by reference in their entireties.

BACKGROUND

The fabrication of piezoelectric micromechanical ultrasonic transducers (PMUTs) can be integrated with CMOS semiconductor processing. PMUTs can be fabricated by MEMS processing and include a piezoelectric layer in a piezoelectric capacitor configuration, including one electrode on one side of the piezoelectric layer and another electrode on another side of the piezoelectric layer. For example, a PMUT can be configured as a transmitter (ultrasonic transmitter) or a receiver (ultrasonic receiver). The resulting integrated circuit can be a touch-sensing integrated circuit and can include a semiconductor substrate (typically, a silicon substrate), signal processing circuitry on the semiconductor substrate, and one or more PMUTs overlying the semiconductor substrate. A high level of integration can be achieved by connecting the PMUT electrodes to the signal processing circuitry on the semiconductor substrate.

In some use cases, the aforementioned touch-sensing integrated circuit is processed into an integrated circuit package. The IC package typically contains an epoxy adhesive on top of the PMUT. The IC package is combined with a cover layer having an exposed outer surface and an inner surface, the IC package being attached to the inner surface via another adhesive. In such use cases, the touch-sensing integrated circuit can be used to detect touching of the exposed outer surface by a digit, such as a human finger. However, in order to obtain better functionality and discrimination, an integrated circuit device capable of concurrently detecting touch and measuring an applied force is desired.

SUMMARY OF THE INVENTION

In one aspect, a force-measuring and touch-sensing integrated circuit device includes a semiconductor substrate, a thin-film piezoelectric stack overlying the semiconductor substrate, piezoelectric micromechanical force-measuring elements (PMFEs), and piezoelectric micromechanical ultrasonic transducers (PMUTs). The thin-film piezoelectric stack includes a piezoelectric layer. The PMFEs and PMUTs are located at respective lateral positions along the thin-film piezoelectric stack, such that each of the PMFEs and PMUTs includes a respective portion of the thin-film piezoelectric stack.

In another aspect, each PMUT has: (1) a cavity, (2) the respective portion of the thin-film piezoelectric stack, (3) a first PMUT electrode on one side of the thin-film piezoelectric stack, and (4) a second PMUT electrode on another side of the thin-film piezoelectric stack. The cavity is positioned between the thin-film piezoelectric stack and the semiconductor substrate. The PMUTs include transmitters and receivers. The transmitters are configured to transmit, upon application of voltage signals between the respective PMUT electrodes, ultrasound signals in longitudinal mode(s) along a normal direction approximately normal to the piezoelectric layer and away from the cavities. The receivers are configured to output, in response to ultrasound signals arriving along the normal direction, voltage signals between the respective PMUT electrodes.

In yet another aspect, each PMFE has: (1) the respective portion of the thin-film piezoelectric stack, (2) a first PMFE electrode on one side of the thin-film piezoelectric stack, and (3) a second PMFE electrode on another side of the thin-film piezoelectric stack. Each PMFE 15 configured to output voltage signals between the PMFE electrodes in accordance with a time-varying strain at the respective portion of the piezoelectric layer resulting from a low-frequency mechanical deformation.

The above summary of the present invention is not intended to describe each disclosed embodiment or every implementation of the present invention. The description that follows more particularly exemplifies illustrative embodiments. In several places throughout the application, guidance is provided through examples, which examples can be used in various combinations. In each instance of a list, the recited list serves only as a representative group and should not be interpreted as an exclusive list.

BRIEF DESCRIPTION OF THE FIGURES

The disclosure may be more completely understood in consideration of the following detailed description of various embodiments of the disclosure in connection with the accompanying drawings, in which.

DETAILED DESCRIPTION OF ILLUSTRATIVE EMBODIMENTS

The present disclosure relates to force-measuring and touch-sensing integrated circuit devices and apparatuses incorporating them.

In this Disclosure:

The words "preferred" and "preferably" refer to embodiments of the invention that may afford certain benefits, under certain circumstances. However, other embodiments may also be preferred, under the same or other circumstances. Furthermore, the recitation of one or more preferred embodiments does not imply that other embodiments are not useful and is not intended to exclude other embodiments from the scope of the invention.

The terms "comprises" and variations thereof do not have a limiting meaning where these terms appear in the description and claims.

Unless otherwise specified, "a," "an," "the," and "at least one" are used interchangeably and mean one or more than one.

The recitations of numerical ranges by endpoints include all numbers subsumed within that range (e.g., 1 to 5 includes 1, 1.5, 2, 2.75, 3, 3.80, 4, 5, etc.).

For any method disclosed herein that includes discrete steps, the steps may be conducted in any feasible order. As appropriate, any combination of two or more steps may be conducted simultaneously.

Figure 1:
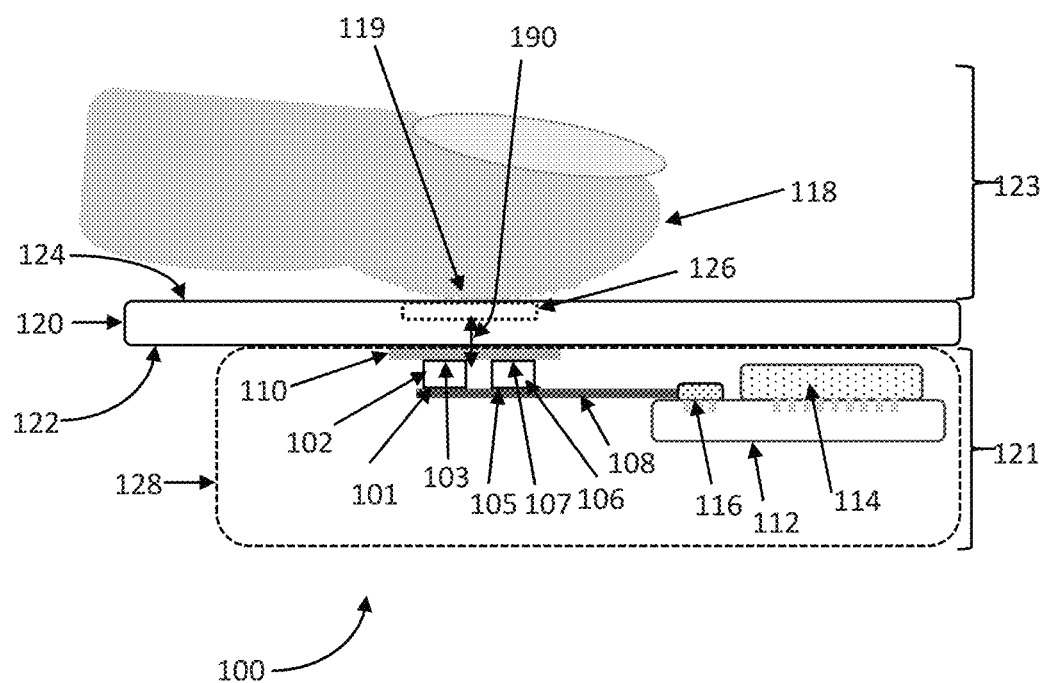
FIG. 1 is a schematic view of an illustrative apparatus including at least one force-measuring, touch-sensing integrated circuit device.

FIG. 1 is a schematic view of an apparatus 100 according to the present invention. In the example shown, apparatus 100 includes force-measuring and touch-sensing integrated circuit (FMTSIC) devices 102, 106. We sometimes refer to an FMTSIC device as an FMTSIC. In other examples, it is possible for an apparatus to have a single integrated circuit device or more than two integrated circuit devices. Each of the FMTSIC devices 102, 106 has an electrical interconnection surface (bottom surface) 101, 105 and an ultrasound transmission surface (top surface) 103, 107. In the example shown, each FMTSIC device 102, 106 is in the form of a semiconductor die in a package. The FMTSIC devices are mounted to a flexible circuit substrate 108 (e.g., an FPC or flexible printed circuit) on the electrical interconnection surfaces 101, 105. The flexible circuit substrate 108 is electrically and mechanically connected to a printed circuit board (PCB) 112 via a connector 116. Other ICs 114 are mounted on the PCB 112, and such other ICs 114 could be a microcontroller (MCU), microprocessor (MPU), and/or a digital signal processor (DSP), for example. These other ICs 114 could be used to run programs and algorithms to analyze and categorize touch events based on data received from the FMTSIC devices 102, 106.

Apparatus 100 includes a cover layer 120 having an exposed outer surface 124 and an inner surface 122. The cover layer 120 could be of any robust layer(s) that transmits ultrasound waves, such as wood, glass, metal, plastic, leather, fabric, and ceramic. The cover layer should be robust but should be sufficiently deformable, such that a deformation of the cover layer is transmitted to the PMFEs in the FMTSIC devices, as described in FIGS. 12, 13, and 14. The cover layer 120 could also be a composite stack of any of the foregoing materials. The FMTSIC devices 102, 106 are adhered to or attached to the inner surface 122 of the cover layer 120 by a layer of adhesive 110. The choice of adhesive 110 is not particularly limited as long as the FMTSIC remains attached to the cover layer. The adhesive 110 could be double-sided tape, pressure sensitive adhesive (PSA), epoxy adhesive, or acrylic adhesive, for example. FMTSIC devices 102, 106 are coupled to the inner surface 122. In operation, the FMTSIC devices 102, 106 generate ultrasound waves in longitudinal modes that propagate along a normal direction 190, shown in FIG. 1 as being approximately normal to the exposed outer surface 124 and the inner surface 122 of the cover layer. Stated more precisely, the normal direction 190 is normal to a piezoelectric layer. Since the piezoelectric layer defines a plane of a piezoelectric capacitor, the normal direction 190 is approximately normal to a plane of the piezoelectric capacitor. The generated ultrasound waves exit the FMTSIC devices 102, 106 through the respective ultrasound transmission surfaces 103, 107, through the adhesive layer 110, then through the inner surface 122, and then through the cover layer 120. The ultrasound waves reach a sense region 126 of the exposed outer surface 124. The sense region 126 is a region of the exposed outer surface 124 that overlaps the FMTSIC devices 102, 106.

FIG. 1 illustrates a use case in which a human finger 118 is touching the cover layer at the sense region 126. If there is no object touching the sense region 126, the ultrasound waves that have propagated through the cover layer 120 are reflected at the exposed outer surface (at the air-material interface) and the remaining echo ultrasound waves travel back toward the FMTSIC devices 102, 106. On the other hand, if there is a finger 118 touching the sense region, there is relatively large attenuation of the ultrasound waves by absorption through the finger. As a result, it is possible to detect a touch event by measuring the relative intensity or energy of the echo ultrasound waves that reach the FMTSIC devices 102, 106.

It is possible to distinguish between a finger touching the sense region 126 and a water droplet landing on the sense region 126, for example. When a finger touches the sense region 126, the finger would also exert a force on the cover layer 120. The force exerted by the finger on the cover layer can be detected and measured using the PMFEs in the FMTSIC. On the other hand, when a water droplet lands on the sense region, the force exerted by the water droplet on the PMFEs would be quite small, and likely less than a noise threshold. More generally, it is possible to distinguish between a digit that touches and presses the sense region 126 and an inanimate object that comes into contact with the sense region 126. In both cases (finger touching the sense region or water droplet landing on the sense region), there would be a noticeable decrease in an amplitude of the PMUT receiver signal, indicating a touch at the sense region, but there might not be enough information from the PMUT receiver signal to distinguish between a finger and a water droplet.

There are numerous possible embodiments of the apparatus 100. For example, the FMTSICs can replace conventional buttons on Smartphones, keys on computer keyboards, sliders, or track pads. The interior contents 128 of apparatus 100 (e.g., FMTSICs 102, 106, flexible circuit substrate 108, connector 116, PCB 112, other ICs 114) can be sealed off from the exterior 123 of the cover layer 120, so that liquids on the exterior 123 cannot penetrate into the interior 121 of the apparatus 100. The ability to seal the interior of the apparatus from the outside helps to make an apparatus, such as a Smartphone or laptop computer, waterproof. There are some applications, such as medical applications, where waterproof buttons and keyboards are strongly desired. Apparatus 100 can be a mobile appliance (e.g., Smartphone, tablet computer, laptop computer), a household appliance (e.g., washing machine, dryer, light switches, air conditioner, refrigerator, oven, remote controller devices), a medical appliance, an industrial appliance, an office appliance, an automobile, or an airplane, for example.

Figure 2:
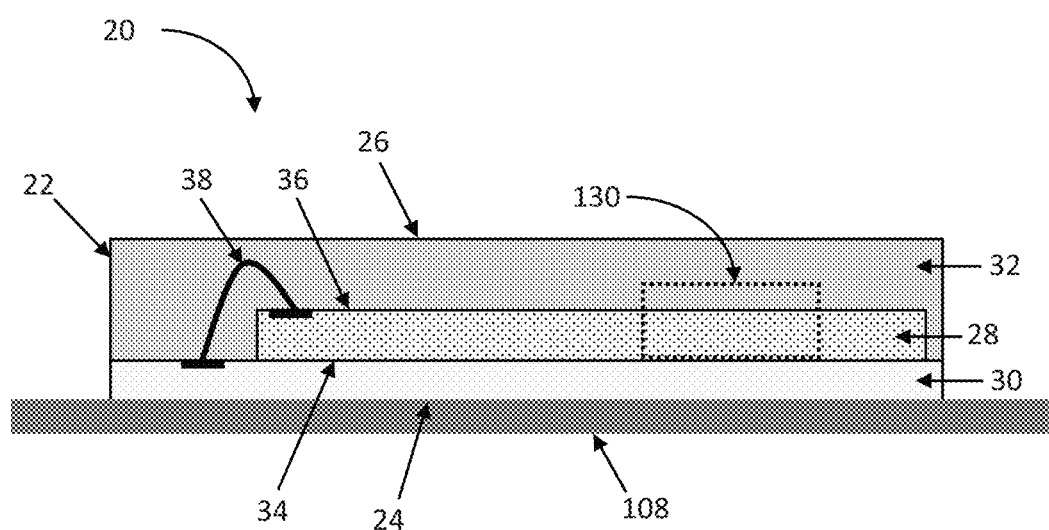
FIG. 2 is a schematic cross-sectional view of a force-measuring, touch-sensing integrated circuit device.

The force-measuring, touch-sensing integrated circuit (FMTSIC) device is shown in greater detail in FIG. 2. FIG. 2 is a cross-sectional view the FMTSIC device 20, which is analogous to devices 102, 106 in FIG. 1. FMTSIC device 20 is shown encased in a package 22, with an ultrasound transmission surface (top surface) 26 and electrical interconnection surface (bottom surface) 24. Ultrasound transmission surface 26 is analogous to surfaces 103, 107 in FIG. 1 and electrical interconnection surface 24 is analogous to surfaces 101, 105 in FIG. 1. The FMTSIC device 20 includes a package substrate 30, semiconductor portion (chip) 28 mounted to the package substrate 30, and an encapsulating adhesive 32, such as an epoxy adhesive. After the semiconductor die 28 is mounted to the package substrate 30, wire bond connections 38 are formed between the die 28 and the package substrate 30. Then the entire assembly including the die 28 and the package substrate 30 are molded (encapsulated) in an epoxy adhesive 32. The epoxy side (top surface or ultrasound transmission surface 26) of the FMTSIC device is adhered to (coupled to) the inner surface 122 of the cover layer 120. The FMTSIC device 20 is shown mounted to the flexible circuit substrate 108. It is preferable that the FMTSIC device have lateral dimensions no greater than 10 mm by 10 mm. The wire bond connection is formed between the top surface 36 of the semiconductor die 28 and the package substrate 30. Alternatively, electrical interconnections can be formed between the bottom surface 34 of the semiconductor die 28 and the package substrate. The semiconductor die 28 consists of an application-specific integrated circuit (ASIC) portion and a micro-electro-mechanical systems (MEMS) portion. A selected portion 130 of the semiconductor die 28 is shown in cross-section in FIG. 3.

Figure 3:
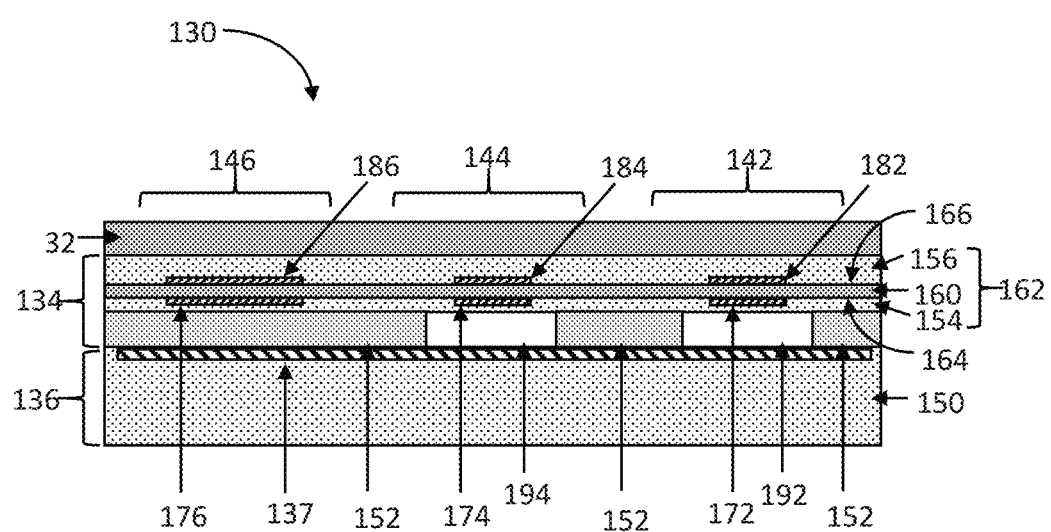
FIG. 3 is a schematic cross-sectional view of a certain portion of the force-measuring, touch-sensing integrated circuit device of FIG. 2.

FIG. 3 is a schematic cross-sectional view of a portion 130 of the force-measuring, touch-sensing integrated circuit device of FIG. 2. The semiconductor die 28 includes a MEMS portion 134 and an ASIC portion 136. Between the ASIC portion 136 and the MEMS portion 134, the MEMS portion 134 is closer to the ultrasound transmission surface 26 and the ASIC portion 136 is closer to the electrical interconnection surface 24. The ASIC portion 136 consists of a semiconductor substrate 150 and signal processing circuitry 137 thereon. Typically, the semiconductor substrate is a silicon substrate, but other semiconductor substrates such as silicon-on-insulator (SOI) substrates can also be used.

The MEMS portion 134 includes a PMUT transmitter 142, a PMUT receiver 144, and a PMFE 146. The MEMS portion 134 includes a thin-film piezoelectric stack 162 overlying the semiconductor substrate 150. The thin-film piezoelectric stack 162 includes a piezoelectric layer 160, which is a layer exhibiting the piezoelectric effect. Suitable materials for the piezoelectric layer 160 are aluminum nitride, scandium-doped aluminum nitride, polyvinylidene fluoride (PVDF), lead zirconate titanate (PZT), $K_xNa_{1-x}NbO_3$ (KNN), quartz, zinc oxide, and lithium niobate, for example. For example, the piezoelectric layer is a layer of aluminum nitride having a thickness of approximately 1 µm. The piezoelectric layer 160 has a top major surface 166 and a bottom major surface 164 opposite the top major surface 166. In the example shown, the thin-film piezoelectric stack 162 additionally includes a top mechanical layer 156, attached to or adjacent to (coupled to) top major surface 166, and a bottom mechanical layer 154, attached to or adjacent to (coupled to) bottom major surface 164. In the example shown, the thickness of the top mechanical layer 156 is greater than the thickness of the bottom mechanical layer 154. In other examples, the thickness of the top mechanical layer 156 can be smaller than the thickness of the bottom mechanical layer 154. Suitable materials for the mechanical layer(s) are silicon, silicon oxide, silicon nitride, and aluminum nitride, for example. Suitable materials for the mechanical layer(s) can also be a material that is included in the piezoelectric layer 160, which in this case is aluminum nitride. In the example shown, the top mechanical layer and the bottom mechanical layer contain the same material. In other examples, the top mechanical layer and the bottom mechanical layer are of different materials. In other examples, one of the top mechanical layer and the bottom mechanical layer can be omitted. When coupled to the cover layer, the FMTSIC device 20 is preferably oriented such that the piezoelectric layer 160 faces toward the cover layer 120. For example, the FMTSIC device 20 is oriented such that the piezoelectric layer 160 and the cover layer 120 are approximately parallel.

For ease of discussion, only one of each of the PMUT transmitters, PMUT receivers, and PMFEs is shown in FIG. 3. However, a typical FMTSIC can contain a plurality of PMUT transmitters, PMUT receivers, and PMFEs. The PMUT transmitters, the PMUT receivers, and the PMFEs are located along respective lateral positions along the thin-film piezoelectric stack 162. Each PMUT transmitter, PMUT receiver, and PMFE includes a respective portion of the thin-film piezoelectric stack.

Each of the PMUTs is configured as a transmitter (142) or a receiver (144). Each PMUT (142, 144) includes a cavity (192, 194) and a respective portion of the thin-film piezoelectric stack 162 overlying the cavity (192, 194). The cavities are laterally bounded by an anchor layer 152 which supports the thin-film piezoelectric stack. Suitable materials for the anchor layer 152 are silicon, silicon nitride, and silicon oxide, for example. Suitable materials for the anchor layer 152 can also be a material that is included in the piezoelectric layer 160, which in this case is aluminum nitride. Each PMUT (142, 144) includes a first PMUT electrode (172, 174) positioned on a first side (bottom surface) 164 of the piezoelectric layer 160 and a second PMUT electrode (182, 184) positioned on a second side (top surface) 166 opposite the first side. In each PMUT (142, 144), the first PMUT electrode (172, 174), the second PMUT electrode (182, 184), and the piezoelectric layer 160 between them constitute a piezoelectric capacitor. The first PMUT electrodes (172, 174) and the second PMUT electrodes (182, 184) are coupled to the signal processing circuitry 137. The cavities (172, 174) are positioned between the thin-film piezoelectric stack 162 and the semiconductor substrate 150. In the example shown, the FMTSIC device 20 is in the form of an encapsulated package 22. The cavities 192, 194 are preferably under low pressure (pressure lower than atmospheric pressure or in vacuum) and remain so because of the package 22.

Each PMFE 146 includes a respective portion of the thin-film piezoelectric stack 162. Each PMFE 146 includes a first PMFE electrode 176 positioned on a first side (bottom surface) 164 of the piezoelectric layer 160 and a second PMFE electrode 186 positioned on a second side (top surface) 166 opposite the first side. In each PMFE 146, the first PMFE electrode 176, the second PMFE electrode 186, and the piezoelectric layer 160 between them constitute a piezoelectric capacitor. The PMFEs are coupled to the signal processing circuitry 137. In the example shown, the PMFE is not overlying any cavity.

Figure 5:
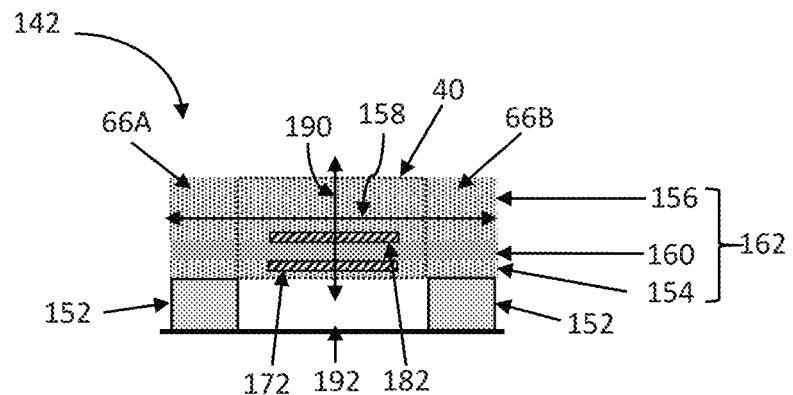
FIGS. 5, 6, and 7 are schematic cross-sectional views of a PMUT transmitter.
Figure 6:
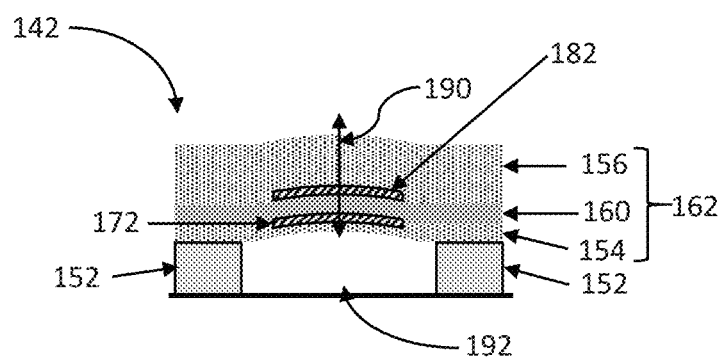
Figure 7:
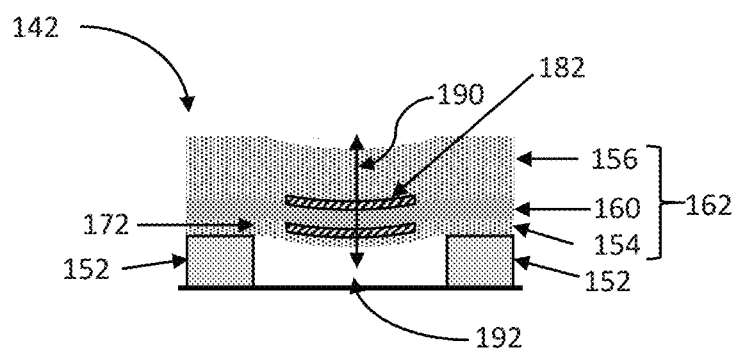

The PMUT transmitter 142 is shown in cross section in FIGS. 5, 6, and 7. In the example shown, the thickness of the top mechanical layer 156 is greater than the thickness of the bottom mechanical layer 154, and the top mechanical layer 156 and the bottom mechanical layer 154 contain the same material, aluminum nitride. In this case, the neutral axis 158 is positioned within the top mechanical layer 156. The neutral axis is the axis in the beam (in this case, the beam is the piezoelectric stack 162) along which there are no normal stresses or strains during bending. FIG. 5 shows the PMUT transmitter in a quiescent state, in which there is no voltage applied between the first PMUT electrode 172 and the second PMUT electrode 182. The piezoelectric layer 160 has a built-in polarization (piezoelectric polarization) that is approximately parallel to normal direction 190. Normal direction 190 is normal to the piezoelectric layer 160. Normal direction 190 is approximately normal to a plane of the respective piezoelectric capacitor. FIG. 6 shows the PMUT transmitter in a first transmitter state, in which there is a first transmitter voltage $V_{Tx1}$ (corresponding to a certain polarity and magnitude) applied between the electrodes (172, 182). As a result, the piezoelectric stack 162 flexes upward (away from the cavity 192).

Figure 4:
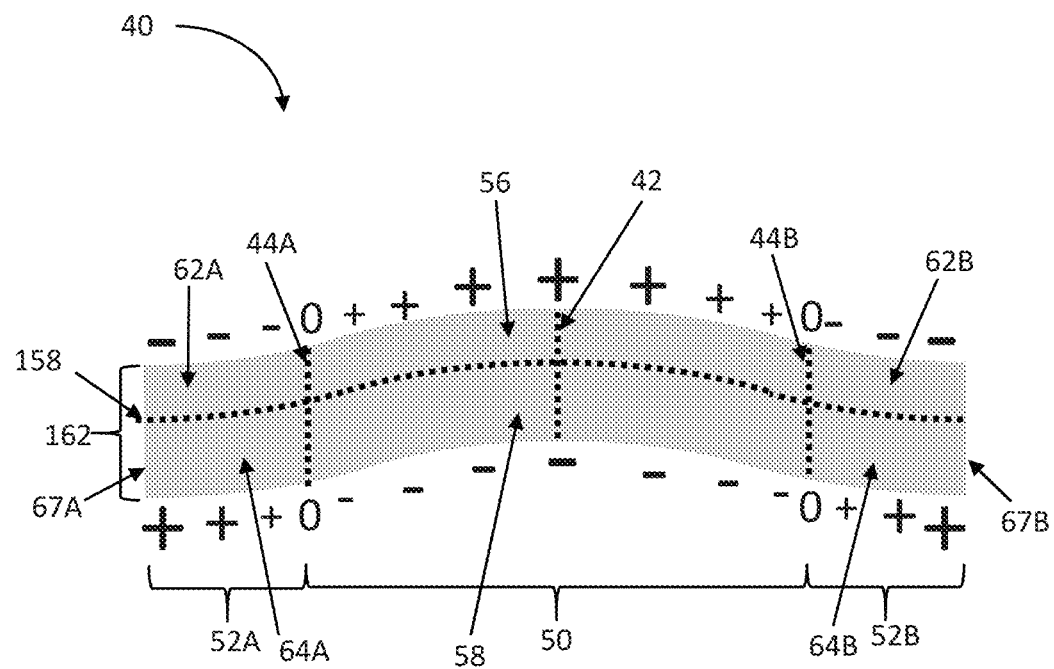
FIG. 4 is a schematic cross-sectional view of a deformable portion of a thin-film piezoelectric stack.

In FIG. 5, a portion 40 of the piezoelectric stack 162 overlying the cavity 192 is bendable whereas the other portions (66A, 66B) of the piezoelectric stack 162 are anchored over the anchoring layer 152. FIG. 4 is a schematic cross-sectional view of the bendable portion 40 of a thin-film piezoelectric stack 162. For simplifying the discussion, individual electrodes and cover layers present in FIGS. 5 and 6 have been omitted. In the idealized case, the left edge (67A) and right edge (67B) of the illustrated portion 40 are anchored and cannot move. FIG. 4 shows a first state, in which the piezoelectric stack 162 is flexed upward. A point of greatest deviation from the quiescent state is labeled 42 and corresponds approximately to a central point between the anchored edges (67A, 67B). At central point 42, there is the greatest tensile (positive) strain in a region 56 above the neutral axis 158 and the greatest compressive (negative) strain in a region 58 below the neutral axis 158. Proceeding radially outward from the central point 42 toward the anchored edges (67A or 67B), the tensile (positive) strain in the region 56 above the neutral axis 158 decreases to 0 at the inflection point (44A or 44B). Proceeding radially outward from the central point 42 toward the anchored edges (67A or 67B), the compressive (negative) strain in the region 58 below the neutral axis 158 decreases to 0 (becomes less negative and reaches 0) at the inflection point (44A or 44B). Furthermore, in outer regions between the inflection point (44A or 44B) and the anchored edges (67A or 67B), the polarities of the strains are reversed. Specifically, in a region 62A, 62B above the neutral axis 158, the strain is compressive (negative), and in a region 64A, 64B below the neutral axis 158, the strain is tensile (positive). The inflection point of a thin-film piezoelectric stack gives a lateral position along the thin-film piezoelectric stack at which the stress is 0. The stress changes sign (from negative to positive or positive to negative) upon laterally traversing the inflection point. In a middle region in between the inflection points of the piezoelectric stack, there is compressive (negative) strain in portions of the piezoelectric stack 162 below the neutral axis 158, including the piezoelectric layer 160, and tensile (positive) strain in portions of the piezoelectric stack 162 above the neutral axis 158. In the first state, the piezoelectric layer 160 is contracting or is in compression (negative strain) in this middle region. In this middle region, the piezoelectric layer is covered by the PMUT electrodes (172, 182).

FIG. 7 shows the PMUT transmitter in a second transmitter state, in which there is a second transmitter voltage $V_{Tx2}$ (corresponding to a certain polarity and magnitude) applied between the PMUT electrodes (172, 182). In a middle region in between the inflection points of the piezoelectric stack, there is tensile (positive) strain in portions of the piezoelectric stack 162 below the neutral axis 158, including the piezoelectric layer 160, and compressive (negative) strain in portions of the piezoelectric stack 162 above the neutral axis 158. As a result, the portion of the piezoelectric stack 162 overlying the cavity 192 flexes downward (toward the cavity 192). The signal processing circuitry 137 is operated to generate and apply a time-varying voltage signal $V_{Tx}(t)$ between the PMUT electrodes (172, 182) of the PMUT transmitter 142. If the time-varying voltage signal oscillates between the first transmitter voltage and the second transmitter voltage at a certain frequency, the portion of the piezoelectric stack 162 oscillates between the first transmitter state and the second transmitter state at that frequency. As a result, the PMUT transmitter generates (transmits), upon application of the time-varying voltage signal, ultrasound signals propagating along the normal direction 190. Because of the presence of the cavity 192 at a low pressure, a relatively small fraction of the generated ultrasound energy is transmitted downward toward the cavity 192, and a relatively large fraction of the generated ultrasound energy is transmitted upward away from the cavity 192. The PMUT transmitters are configured to transmit ultrasound signals of a frequency in a range of 0.1 MHz to 25 MHz.

Figure 8:
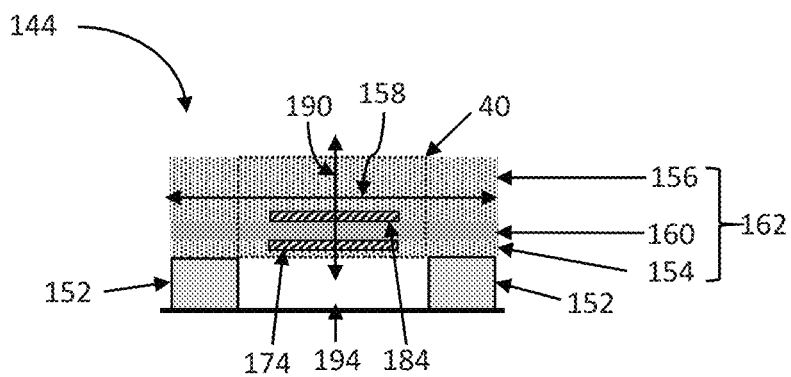
FIGS. 8, 9, and 10 are schematic cross-sectional views of a PMUT receiver.
Figure 9:
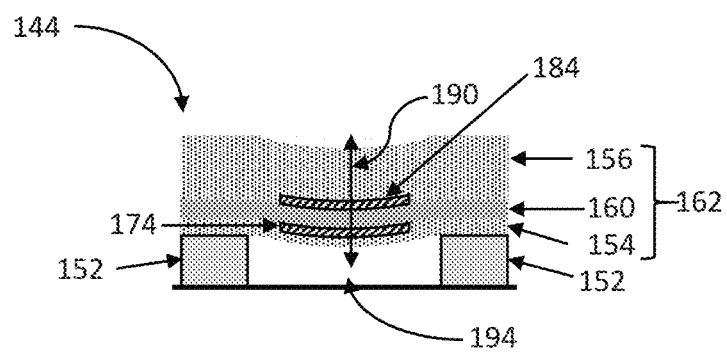
Figure 10:
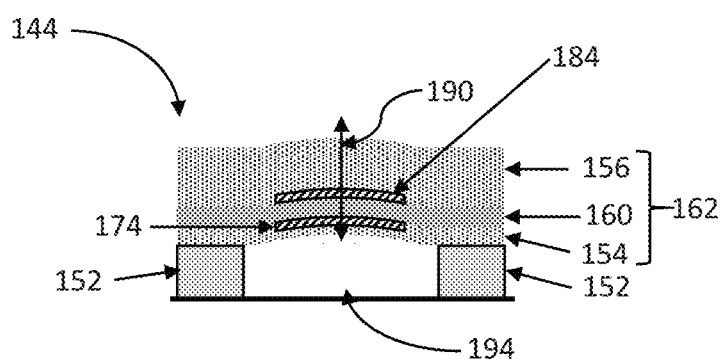

The PMUT receiver 144 is shown in cross section in FIGS. 8, 9, and 10. FIG. 8 shows the PMUT receiver in a quiescent state, in which there is no flexing of the piezoelectric stack 162 away from or towards the cavity 194. In the quiescent state, there is no voltage generated between the PMUT electrodes (174, 184). FIG. 9 shows the PMUT receiver in a first receiver state, in which a positive ultrasound pressure wave is incident on the PMUT receiver, along the normal direction 190, to cause the portion of the piezoelectric stack 162 overlying the cavity 194 to flex downwards (towards the cavity 194). In a middle region in between the inflection points of the piezoelectric stack, there is tensile (positive) strain in portions of the piezoelectric stack 162 below the neutral axis 158, including the piezoelectric layer 160, and compressive (negative) strain in portions of the piezoelectric stack 162 above the neutral axis 158. As a result, a first receiver voltage $V_{Rx1}$ (corresponding to a certain polarity and magnitude) is generated between the PMUT electrodes (174, 184).

FIG. 10 shows the PMUT receiver in a second receiver state, in which a negative ultrasound pressure wave is incident on the PMUT receiver, along the normal direction 190, to cause the portion of the piezoelectric stack 162 overlying the cavity 194 to flex upwards (away from the cavity 194). In a middle region in between the inflection points of the piezoelectric stack, there is compressive (negative) strain in portions of the piezoelectric stack 162 below the neutral axis 158, including the piezoelectric layer 160, and tensile (positive) strain in portions of the piezoelectric stack 162 above the neutral axis 158. As a result, a second receiver voltage $V_{Rx2}$ (corresponding to a certain polarity and magnitude) is generated between the PMUT electrodes (174, 184). If ultrasound signals are incident on the PMUT receiver 144 along the normal direction 190 causing the portion of the piezoelectric stack 162 to oscillate between the first receiver state and the second receiver state, a time-varying voltage signal $V_{Rx}(t)$ oscillating between the first receiver voltage and the second receiver voltage is generated between the PMUT electrodes (174, 184). The time-varying voltage signal is amplified and processed by the signal processing circuitry 137.

In operation, the PMUT transmitter 142 is configured to transmit, upon application of voltage signals between the PMUT transmitter electrodes (172, 182), ultrasound signals of a first frequency $F_1$, in longitudinal mode(s) propagating along a normal direction 190 approximately normal to the piezoelectric layer 160 away from the cavity 192 towards the sense region 126. The ultrasound signals propagate towards the sense region 126 of the cover layer 120 to which FMTSIC 20 is coupled. Upon application of the voltage signals, the respective portion of the piezoelectric stack overlying the cavity 192 (of the PMUT transmitter 142) oscillates with a first frequency $F_1$ between a first transmitter state and a second transmitter state to generate ultrasound signals of the first frequency $F_1$. The PMUT receiver 144 is configured to output, in response to ultrasound signals of the first frequency $F_1$ arriving along the normal direction, voltage signals between the PMUT receiver electrodes (174, 184). In response to ultrasound signals of the first frequency $F_1$ arriving along the normal direction, the portion of the thin-film piezoelectric stack 162 overlying the cavity oscillates at the first frequency $F_1$. Some fraction of the ultrasound signals transmitted by the PMUT transmitter 142 returns to the PMUT receiver 144 as an echo ultrasound signal. In the use case illustrated in FIG. 1, the relative amplitude or energy of the echo ultrasound signal depends upon the presence of a digit (e.g., human finger) or other object (e.g., water drop) touching the sense region 126. If the sense region 126 is touched by a digit or other object, there is greater attenuation of the echo ultrasound signal than if there is no touching at the sense region 126. By amplifying and processing the time-varying voltage signal from the PMUT receiver at the signal processing circuitry, these touch events can be detected.

Figure 11:
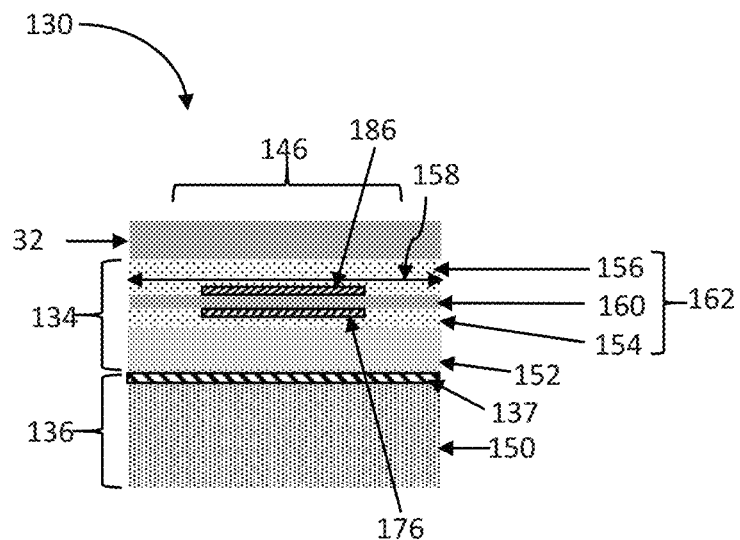
FIG. 11 is a schematic cross-sectional view of a piezoelectric micromechanical force-measuring element (PMFE).

A portion 130 of the FMTSIC 20 containing a PMFE 146 is shown in cross section in FIG. 11. Also shown is the ASIC portion 136 that is under the PMFE 146 and the encapsulating adhesive 32 that is above the PMFE 146. FIG. 11 shows the PMFE in a quiescent state, in which there is no flexing of the piezoelectric stack 162. In the quiescent state, there is no voltage generated between the PMFE electrodes (176, 186).

Figure 12:
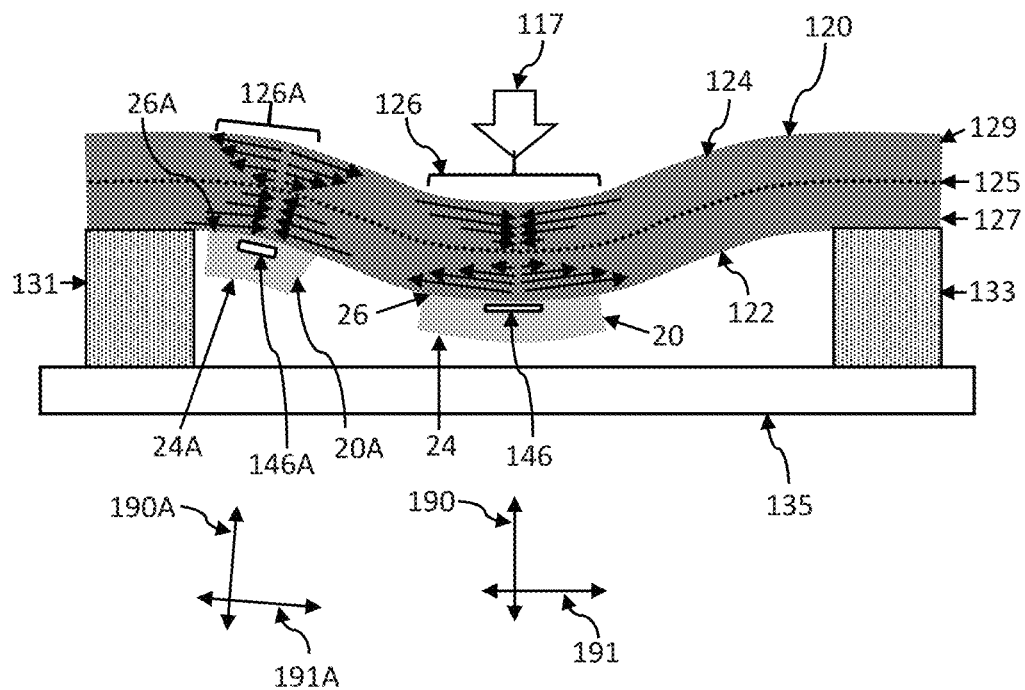
FIGS. 12, 13, and 14 are schematic side views of a force-measuring, touch-sensing integrated circuit device and a cover layer, attached to each other and undergoing deformation.
Figure 13:
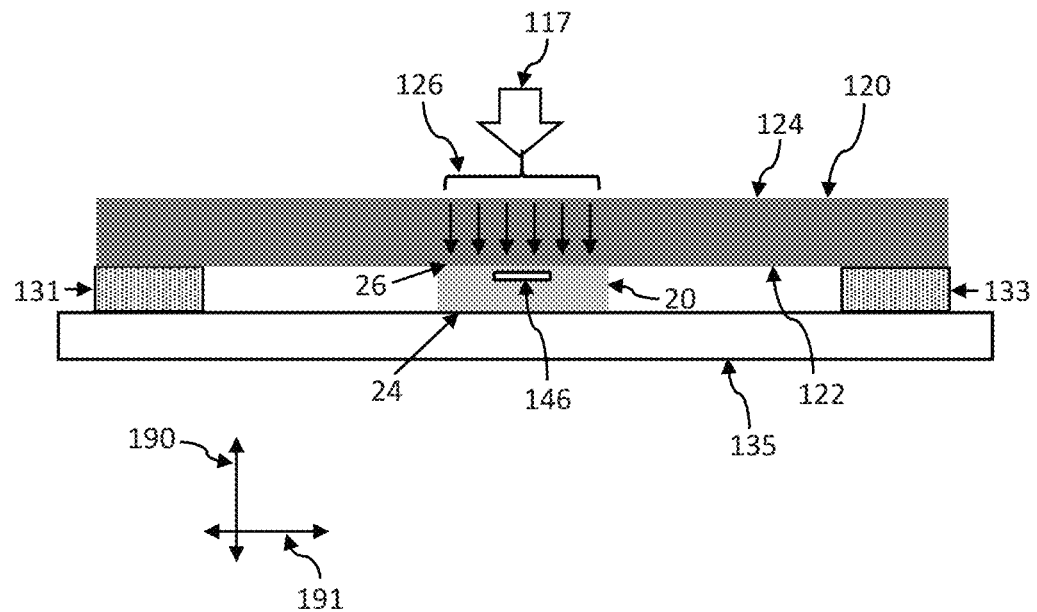
Figure 14:
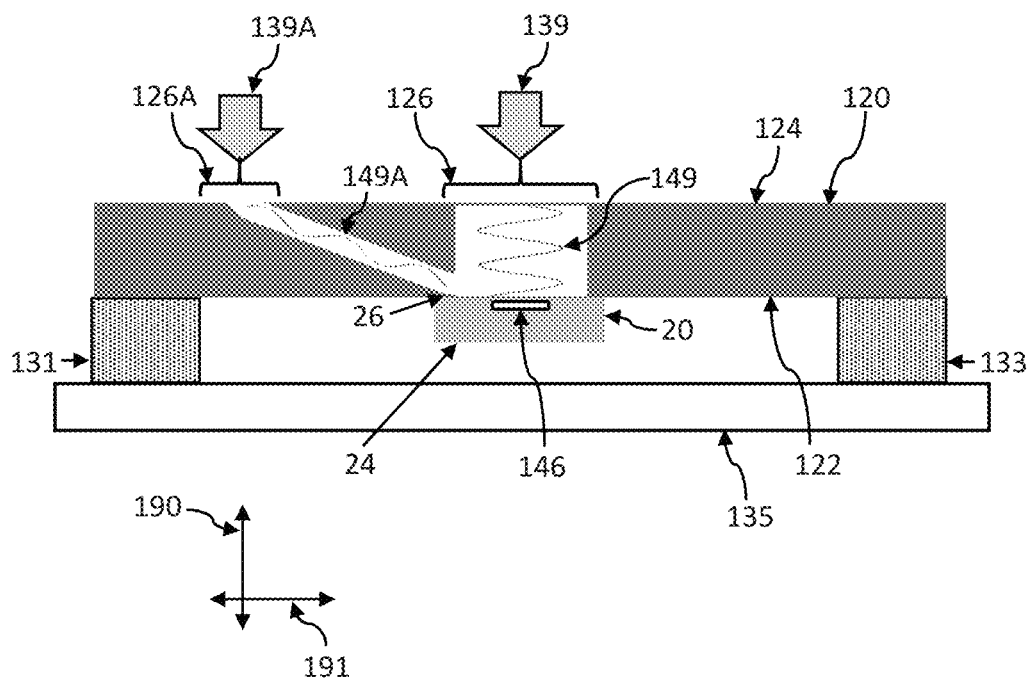

FIGS. 12, 13, and 14 are schematic side views of an FMTSIC 20 and a cover layer 120 attached to or adhered to (coupled to) each other. A top surface (ultrasound transmission surface) 26 of FMTSIC 20 is coupled to inner surface 122 of the cover layer 120. FMTSIC 20 and cover layer 120 overlie a rigid substrate 135. For ease of viewing, other components of apparatus 100 (e.g., flexible circuit substrate 108, ICs 114) have been omitted. FMTSIC 20 includes PMFEs 146. In the examples shown, two anchor posts 131, 133 fix the two ends of the cover layer 120 to the substrate 135.

In the example of FIG. 12, FMTSIC 20 is not anchored to the rigid substrate 135 and can move with the cover layer 120 when the cover layer 120 is deflected upwards or downwards. A downward force 117, shown as a downward arrow, is applied by a digit (or another object) pressing against the outer surface 124 of the cover layer 120 at the sense region 126 for example. A digit pressing against or tapping the outer surface 124 are examples of touch excitation, or more generally, excitation. In the example shown in FIG. 12, the cover layer 120 is deflected in a first direction (e.g., downwards) in response to a touch excitation at the sense region 126. FMTSIC 20 is located approximately half-way between the anchor posts 131, 133 and sense region 126 overlaps FMTSIC 20. A neutral axis 125 is located within the cover layer 120. A lower portion 127 of the cover layer 120, below the neutral axis 125, is under tensile (positive) strain at the sense region 126, represented by outward pointing arrows, primarily along lateral direction 191, perpendicular to the normal direction 190. The lateral direction 191 is approximately parallel to the piezoelectric layer 160 at the respective location of the piezoelectric layer 160 (at region 126). An upper portion 129 of the cover layer 120, above the neutral axis 125, is under compressive (negative) strain at the sense region 126, represented by inward pointing arrows, primarily along lateral direction 191. Since FMTSIC 20 is coupled to the inner surface 122, adjacent to the lower portion 127, the PMFEs 146 are also under tensile (positive) strain. Typically, the entire FMTSIC 20 may be deflected under the applied downward force 117. In the example shown in FIG. 12, the PMFEs 146 are under a positive strain, and the respective portions of the piezoelectric layer 160 at the PMFEs 146 undergo expansion along a lateral direction 191. As a result, an electrical charge is generated at each PMFE (146) between the respective PMFE electrodes (176, 186). This electrical charge is detectable as a first deflection voltage $V_{d1}$ (corresponding to strain of a certain polarity and magnitude). The polarity of the first deflection voltage $V_{d1}$ at a PMFE depends upon the polarity of the strain (positive strain (tensile) or negative strain (compressive)) at the respective portion of the piezoelectric layer between the respective PMFE electrodes of the PMFE. The magnitude of the first deflection voltage $V_{d1}$ at a PMFE depends upon the magnitude of the strain at the respective portion of the piezoelectric layer between the respective PMFE electrodes of the PMFE. Subsequently, when the downward force 117 is no longer applied to the sense region 126, the cover layer 120 deflects in a second direction opposite the first direction (e.g., upwards). This is detectable as a second deflection voltage $V_{d2}$ (corresponding to strain of a certain polarity and magnitude). The polarity of the second deflection voltage $V_{d2}$ at a PMFE depends upon the polarity of the strain at the respective portion of the piezoelectric layer between the respective PMFE electrodes of the PMFE. The magnitude of the second deflection voltage $V_{d2}$ at a PMFE depends upon the magnitude of the strain at the respective portion of the piezoelectric layer between the respective PMFE electrodes of the PMFE.

FIG. 12 shows a second FMTSIC 20A, including PMFEs 146A. A top surface (ultrasound transmission surface) 26A of FMTSIC 20A is coupled to inner surface 122 of the cover layer 120. FMTSIC 20A overlies the rigid substrate 135 and is located at a second region 126A, between anchor post 131 and first FMTSIC 20. Note that FMTSIC 20A is laterally displaced from the location where the downward force 117 is applied to the outer surface 124 (at sense region 126). The lower portion 127 of the cover layer 120 is under compressive (negative) strain at the second region 126A, represented by inward pointing arrows, primarily along the lateral direction 191A, perpendicular to the normal direction 190A. The lateral direction 191A is approximately parallel to the piezoelectric layer 160 at the respective location of the piezoelectric layer 160 (at second region 126A). The upper portion 129 of the cover layer 120 is under tensile (positive) strain at the second region 126A, represented by outward pointing arrows, primarily along the lateral direction 191A. Since FMTSIC 20A is coupled to the inner surface 122, adjacent to the lower portion 127, the PMFEs 146A are also under compressive (negative) strain. These examples illustrate that when the cover layer and the FMTSICs undergo deflection in response to a touch excitation at the outer surface, expansion and/or compression of the piezoelectric layer along the lateral direction may be induced by the deflection of the cover layer.

In the example shown in FIG. 13, the bottom surface 24 of FMTSIC 20 is anchored to the rigid substrate 135. When downward force 117 is applied to the outer surface 124 of the cover layer 120 at sense region 126, the portion of the cover layer 120 at the sense region 126 transmits the downward force along normal direction 190. The portion of the cover layer 120 at the sense region 126 and the FMTSIC 20 undergo compression along normal direction 190. Consequently, the PMFEs 146 including piezoelectric layer 160 are compressed along the normal direction 190, approximately normal to the piezoelectric layer 160. As a result, an electrical charge is generated between the PMFE electrodes (176, 186). This electrical charge is detectable as a voltage $V_c$ (corresponding to a strain of a certain polarity and magnitude) between the PMFE electrodes. The downward force 117 that causes this compression is applied during a touch excitation, such as tapping at or pressing against the outer surface 124. The pressing or the tapping can be repetitive. Typically, the entire FMTSIC 20 may undergo compression. Subsequently, the piezoelectric layer 160 relaxes from the compressed state. In other cases, there may also be compression along a lateral direction 191, or along other directions.

In the example shown in FIG. 14, FMTSIC 20 is not anchored to the rigid substrate 135. A downward force 139, shown as a downward arrow, is applied to the outer surface 124 of the cover layer 120 at the sense region 126. The downward force 139 is generated as a result of an impact of touch excitation at the sense region 126. For example, the downward force 139 is generated as a result of the impact of a digit (or another object) tapping the outer surface at the sense region 126. The touch excitation (e.g., tapping) can be repetitive. The impact of the touch excitation (e.g., tapping) generates elastic waves that travel outward from the location of the impact (on the outer surface 124 at sense region 126) and at least some of the elastic waves travel toward the inner surface 122. Accordingly, at least some portion 149 of the elastic waves are incident on the FMTSIC 20.

In general, an impact of a touch excitation (e.g., tapping) on a surface of a stack (e.g., cover layer) can generate different types of waves including pressure waves, shear waves, surface waves and Lamb waves. Pressure waves, shear waves, and surface waves are in a class of waves called elastic waves. Pressure waves (also called primary waves or P-waves) are waves in which the molecular oscillations (particle oscillations) are parallel to the direction of propagation of the waves. Shear waves (also called secondary waves or S-waves) are waves in which the molecular oscillations (particle oscillations) are perpendicular to the direction of propagation of the waves. Pressure waves and shear waves travel radially outwards from the location of impact. Surface waves are waves in which the energy of the waves are trapped within a short depth from the surface and the waves propagate along the surface of the stack. Lamb waves are elastic waves that can propagate in plates. When an object (e.g., a finger) impacts a surface of a stack, different types of elastic waves can be generated depending upon the specifics of the impact (e.g., speed, angle, duration of contact, details of the contact surface), the relevant material properties (e.g., material properties of the object and the stack), and boundary conditions. For example, pressure waves can be generated when an impact of a touch excitation at the outer surface is approximately normal to the outer surface. For example, shear waves can be generated when an impact of a touch excitation at the outer surface has a component parallel to the outer surface, such as a finger hitting the outer surface at an oblique angle or a finger rubbing against the outer surface. Some of these elastic waves can propagate towards the FMTSIC 20 and PMFEs 146. If the stack is sufficiently thin, then some portion of surface waves can propagate towards the FMTSIC 20 and PMFEs 146 and be detected by the PMFEs 146.

Accordingly, when elastic waves 149 are incident on the FMTSIC 20 and PMFEs 146, the elastic waves induce time-dependent oscillatory deformation to the piezoelectric layer 160 at the PMFE 146. This oscillatory deformation can include: lateral deformation (compression and expansion along the lateral direction 191 approximately parallel to piezoelectric layer 160), normal deformation (compression and expansion along the normal direction 190 approximately normal to the piezoelectric layer 160), and shear deformation. As a result, time-varying electrical charges are generated at each PMFE (146) between the respective PMFE electrodes (176, 186). These time-varying electrical charges are detectable as time-varying voltage signals. The signal processing circuitry amplifies and processes these time-varying voltage signals. Typically, the time-dependent oscillatory deformations induced by an impact of a touch excitation are in a frequency range of 10 Hz to 1 MHz. For example, suppose that elastic waves 149 include pressure waves incident on the PMFEs 146 along the normal direction 190; these pressure waves may induce compression (under a positive pressure wave) and expansion (under a negative pressure wave) of the piezoelectric layer 160 along the normal direction 190. As another example, suppose that elastic waves 149 include shear waves incident on the PMFEs 146 along the normal direction 190; these shear waves may induce compression and expansion of the piezoelectric layer 160 along the lateral direction 191.

Consider another case in which a downward force 139A, shown as a downward arrow, is applied to the outer surface 124 at a second region 126A, between anchor post 131 and FMTSIC 20. The downward force 139A is generated as a result of an impact of touch excitation at the second region 126A. The impact of the touch excitation generates elastic waves that travel outward from the location of the impact (region 126A) and at least some of the elastic waves travel towards the inner surface 122. Accordingly, at least some portion 149A of the elastic waves are incident on the FMTSIC 20, causing the piezoelectric layer 160 to undergo time-dependent oscillatory deformation. As a result, time-varying electrical charges are generated at each PMFE (146) between the respective PMFE electrodes (176, 186). These time-varying electrical charges are detectable as time-varying voltage signals, although the impact of the touch excitation occurred at a second region 126A that is laterally displaced from the sense region 126.

Elastic waves 149A that reach FMTSIC 20 from region 126A may be weaker (for example, smaller in amplitude) than elastic waves 149 that reach FMTSIC 20 from sense region 126, because of a greater distance between the location of impact and the FMTSIC. An array of PMFEs can be configured to be a position-sensitive input device, sensitive to a location of the impact (e.g., tapping) of a touch excitation. An array of PMFEs can be an array of PMFEs in a single FMTSIC or arrays of PMFEs in multiple FMTSICs. For example, a table input apparatus could have an array of FMTSICs located at respective lateral positions underneath the table's top surface, in which each FMTSIC would contain at least one PMFE and preferably multiple PMFEs. The signal processing circuitry can be configured to amplify and process the time-varying voltage signals from the PMFEs and analyze some features of those time-varying voltage signals. Examples of features of time-varying voltage signals are: (1) amplitudes of the time-varying voltage signals, and (2) the relative timing of time-varying voltage signals (the "time-of-flight"). For example, a PMFE exhibiting a shorter time-of-flight is closer to the location of impact than another PMFE exhibiting a longer time-of-flight. The signal processing circuitry can analyze features of time-varying signals (e.g., amplitude and/or time-of-flight) from the PMFEs in an array of PMFEs to estimate a location of impact of a touch excitation.

In operation, PMFE 146 is configured to output voltage signals between the PMFE electrodes (176, 186) in accordance with a time-varying strain at the respective portion of the piezoelectric layer between the PMFE electrodes (176, 186) resulting from a low-frequency mechanical deformation. A touch excitation at the cover layer or at another component mechanically coupled to the cover layer causes a low-frequency mechanical deformation (of the cover layer or other component at the point of excitation). The touch excitation induces effects including deflection (as illustrated in FIG. 12), compression (as illustrated in FIG. 13), and/or elastic-wave oscillations (as illustrated in FIG. 14). In an actual touch event, more than one of these effects may be observable. Consider tapping by a finger as an example of a touch excitation. As the finger impacts the outer surface 124, elastic waves are generated which are detectable as time-varying voltage signals at the PMFEs (FIG. 14). Elastic waves are generated by the impact of the touch excitation. Subsequently, as the finger presses against the cover layer, the FMTSIC undergoes deflection (FIG. 12). There is expansion or compression of the piezoelectric layer along a lateral direction. The low-frequency mechanical deformation can be caused by a digit pressing against or tapping at outer surface of the cover layer 120, to which the FMTSIC 20 is attached (coupled). The PMFE 146 is coupled to the signal processing circuitry 137. By amplifying and processing the voltage signals from the PMFE at the signal processing circuitry, the strain that results from the mechanical deformation of the piezoelectric layer can be measured.

It is possible to adjust the relative amplitudes of the PMFE voltage signals attributable to the elastic-wave oscillations (FIG. 14) and lateral expansion and compression due to deflection (FIG. 12). For example, one can choose the cover layer to be more or less deformable. For example, the cover layer 120 of FIG. 14 may be thicker and/or made of more rigid material than the cover layer 120 of FIG. 12.

PMFE 146 is configured to output voltage signals between the PMFE electrodes (176, 186) in accordance with a time-varying strain at the respective portion of the piezoelectric layer between the PMFE electrodes (176, 186) resulting from a low-frequency mechanical deformation. Typically, the low-frequency deformation is induced by touch excitation which is not repetitive (repetition rate is effectively 0 Hz) or is repetitive having a repetition rate of 100 Hz or less, or 10 Hz or less. These repetition rates correspond to the repetition rates of a repetitive touch excitation, e.g., a digit repeatedly pressing against or tapping the sense region. An example of a repetition rate calculation is explained with reference to FIG. 37 and FIG. 38.

A touch excitation, or more generally, excitation can occur somewhere other than at the sense region. Consider an implementation of FMTSICs in a portable apparatus, such as a smartphone. In some cases, the cover layer, to which the FMTSIC is coupled, can be a portion of the smartphone housing, and in other cases, the housing and the cover layer can be attached to each other, such that forces applied to the housing can be transmitted to the cover layer. We can refer to both cases as a component (e.g., housing) being mechanically coupled to the cover layer. Excitation such as bending of, twisting of, pinching of, typing at, and tapping at the housing can also cause low-frequency mechanical deformation. For example, typing at the housing can include typing at a touch panel of the smartphone. There can be a time-varying strain (force) at a respective portion of the piezoelectric layer at a PMFE resulting from this low-frequency deformation.

Figure 15:
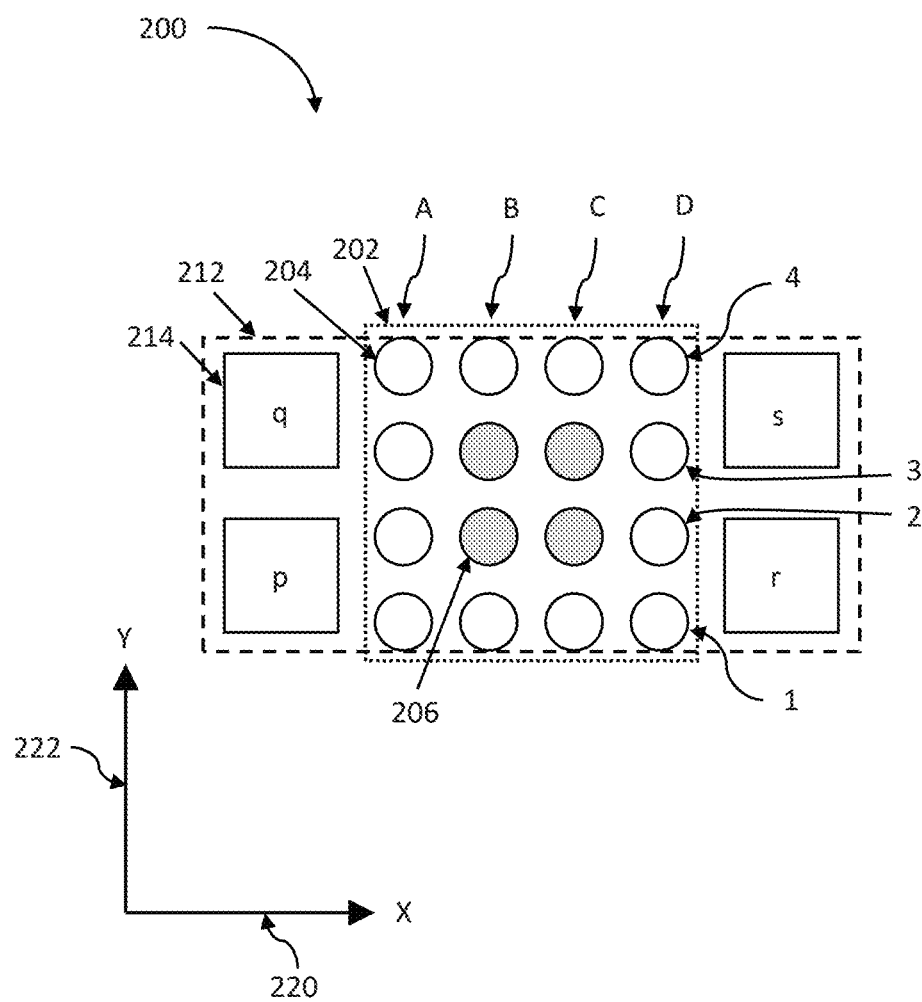
FIGS. 15, 16, and 17 are schematic top views of the MEMS portions of force-measuring, touch-sensing integrated circuit devices.

An FMTSIC can contain multiple PMUT transmitters, PMUT receivers, and PMFEs. FIG. 15 is a top view of a MEMS portion 200 of an FMTSIC device. The PMUTs (PMUT transmitters 204 shown as white circles and PMUT receivers 206 shown as grey circles) are arranged in a two-dimensional array, extending along the X-axis (220) and Y-axis (222). The PMUTs are arranged in columns (A, B, C, and D) and rows (1, 2, 3, and 4). In the example shown, the two-dimensional PMUT array 202 has a square outer perimeter, but in other examples the outer perimeter can have other shapes such as a rectangle. In the example shown, the total number of PMUTs is 16, of which 12 are PMUT transmitters 204 and 4 are PMUT receivers 206. In this example, the PMUT receivers number less than the PMUT transmitters. The PMUTs are shown as circles because the overlap area of the first (bottom) electrode 172 and the second (top) electrode 174 is approximately circular. In other examples, the overlap area can have other shapes, such as a square. In the example shown, the PMUTs are of the same lateral size (area), but in other examples PMUTs of different sizes are also possible.

The PMUT transmitters 204 are configured to transmit, upon application of voltage signals between the respective first PMUT electrode and the respective second PMUT electrode, ultrasound signals of a first frequency $F_1$, in longitudinal mode(s) propagating along a normal direction approximately normal to the piezoelectric stack away from the cavities and towards the sense region. A benefit to a two-dimensional array of PMUT transmitters is that by optimization of the voltage signals to each of the PMUT transmitters, the transmitted ultrasound signals can be made to interfere constructively to achieve a beam-forming effect if desired. The PMUT receivers 206 are configured to output, in response to ultrasound signals of the first frequency $F_1$ arriving along the normal direction, voltage signals between the respective first PMUT electrode and the respective second PMUT electrode. A benefit to a two-dimensional array of PMUT receivers is that the array could achieve two-dimensional positional resolution of a touch event. For example, in the use case shown in FIG. 1, a finger 118 is touching the cover layer 120 at a sense region 126. In particular, the finger has ridges 119 and corresponding valleys in between the ridges. Therefore, some of the PMUT receivers might receive echo ultrasound signals that have undergone greater attenuation at the ridges 119, and some others of the PMUT receivers might receive echo ultrasound signals that have undergone lesser attenuation at the valleys in between the ridges 119.

The MEMS portion includes four PMFEs (214, locations identified as p, q, r, and s) arranged in a two-dimensional array 212. The PMFE array 212 has an opening, which is devoid of PMFEs, in which the PMUT array 202 is disposed. In the example shown, there are PMFEs to the left of (p and q) and to the right of (r and s) of the PMUT array 202. Each PMFE measures an applied force at a different X and Y location. Therefore, the PMFE array 212 achieves a two-dimensional positional resolution of applied forces measurement. An advantage to combining the touch-sensing (PMUTs) and force-measuring (PMFEs) functions into one integrated circuit device is that it becomes possible to distinguish between stationary objects that touch but do not apply significant force (e.g., water droplet on sense region 126) and moving objects that touch and apply significant force (e.g., finger).

Figure 16:
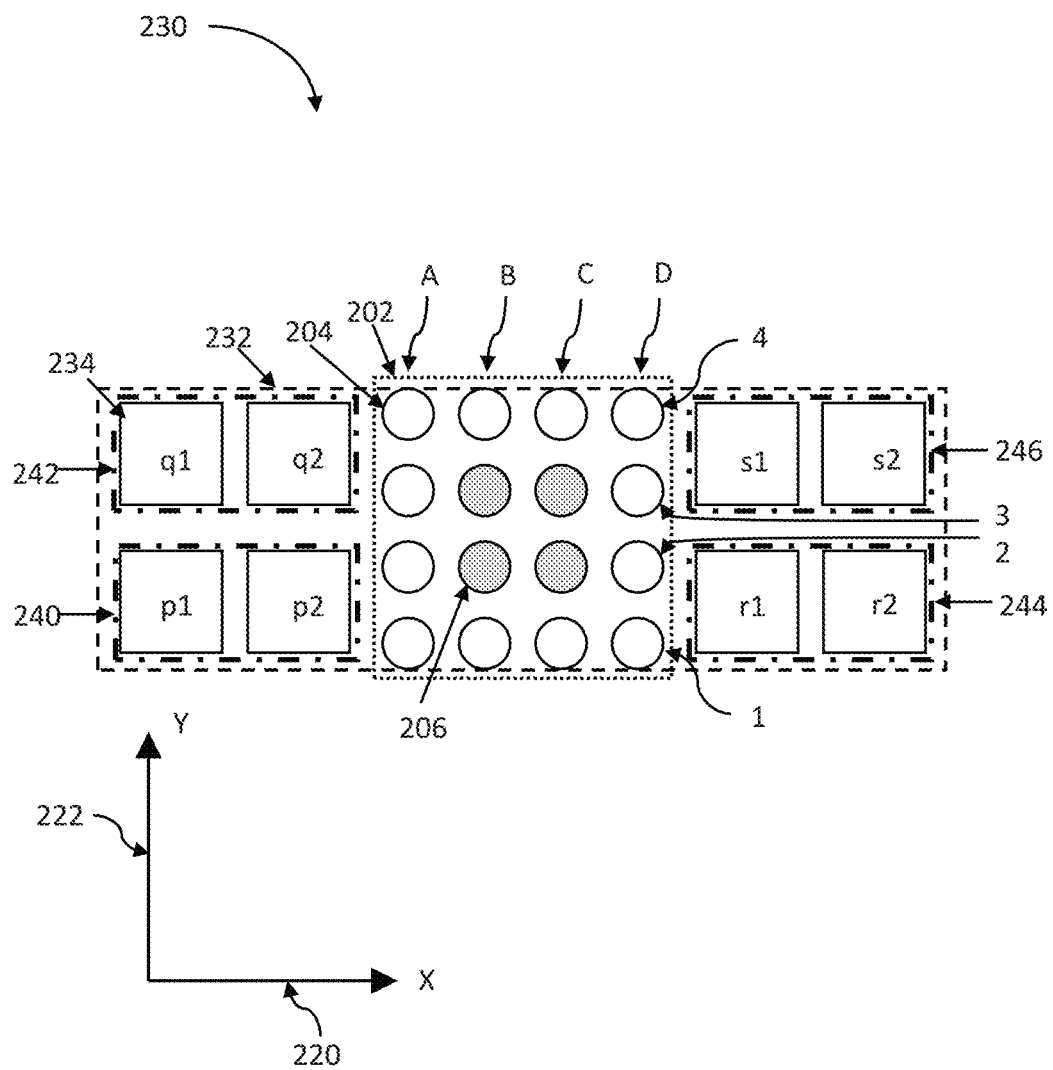

FIG. 16 is a top view of a MEMS portion 230 of an FMTSIC device. The PMUT array 202 is identical to that illustrated in FIG. 15. The MEMS portion includes a PMFE array 232 containing eight PMFEs (234). The PMFEs are arranged into four sets (240, 242, 244, and 246), where each set is associated with a different X and Y location. Therefore, the PMFE array 232 achieves a two-dimensional positional resolution of applied forces measurement. Each PMFE set contains two PMFEs. In the example shown, set 240 contains p1 and p2, set 242 contains q1 and q2, set 244 contains r1 and r2, and set 246 contains s1 and s2. Note that in each set, the two PMFEs are laid side-by-side in the X-direction. The PMFEs in a set are electrically connected to each other. The electrical connections among the PMFEs in a set are described in detail hereinbelow, with reference to FIGS. 23, 24, and 25.

Figure 17:
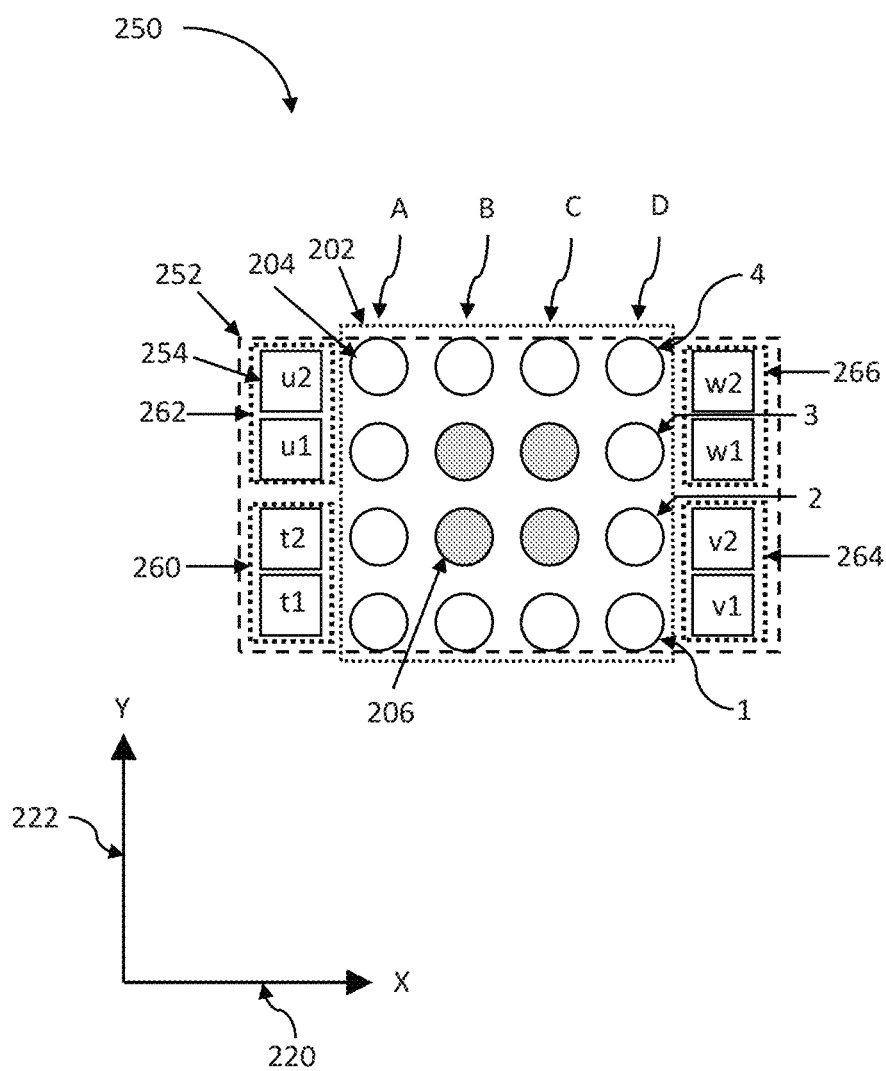

FIG. 17 is a top view of a MEMS portion 250 of an FMTSIC device. The PMUT array 202 is identical to that illustrated in FIGS. 15 and 16. The MEMS portion includes a PMFE array 252 containing eight PMFEs (254). The PMFEs are arranged into four sets (260, 262, 264, and 266), where each set is associated with a different X and Y location. Therefore, the PMFE array 252 achieves a two-dimensional positional resolution of applied forces measurement. This capability is similar to that of PMFE array 232. Each PMFE set contains two PMFEs. In the example shown, set 260 contains t1 and t2, set 262 contains u1 and u2, set 264 contains v1 and v2, and set 246 contains w1 and w2. PMFE array 252 is similar to PMFE array 232 in the total number of PMFEs, the number of PMFE sets, and the number of PMFEs in each set. Note that the size of each PMFE is smaller than in FIG. 16, making it possible to arrange two PMFEs in each set side-by-side in the Y-direction. As a result, the overall footprint of MEMS portion 250 is smaller than that of MEMS portion 230. It is preferable that each PMFE has lateral dimensions no greater than 2.5 mm by 2.5 mm.

Figure 18:
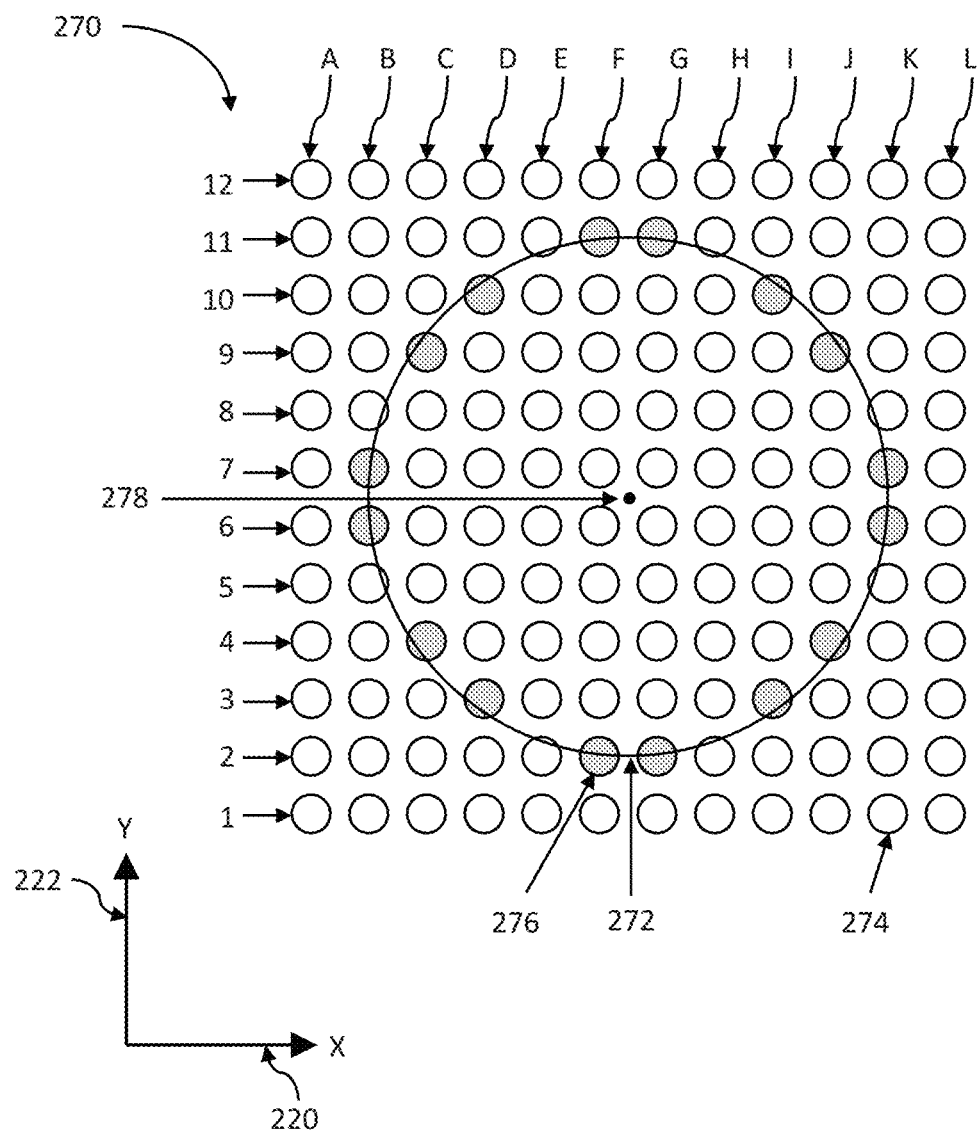
FIGS. 18, 19, 20, 21, and 22 are schematic top views of PMUT arrays.

FIG. 18 is a schematic top view of a PMUT array 270. The PMUTs (PMUT transmitters 274 shown as white circles and PMUT receivers 276 shown as grey circles) are arranged in a two-dimensional array, extending along the X-axis (220) and Y-axis (222). The PMUTs are arranged in twelve columns (A through L) and twelve rows (1 through 12). The PMUT array 270 has a square outer perimeter. The total number of PMUTs is 144, of which 128 are PMUT transmitters 274 and 16 are PMUT receivers 276. The PMUT receivers number less than the PMUT transmitters. A circle 272 is drawn around a central point 278 of the PMUT array 270, to help identify points that are approximately equidistant from the central point 278. The circle 272 intersects all of the PMUT receivers 276. Accordingly, all of the receivers 276 are approximately equidistant from the central point 278.

Figure 19:
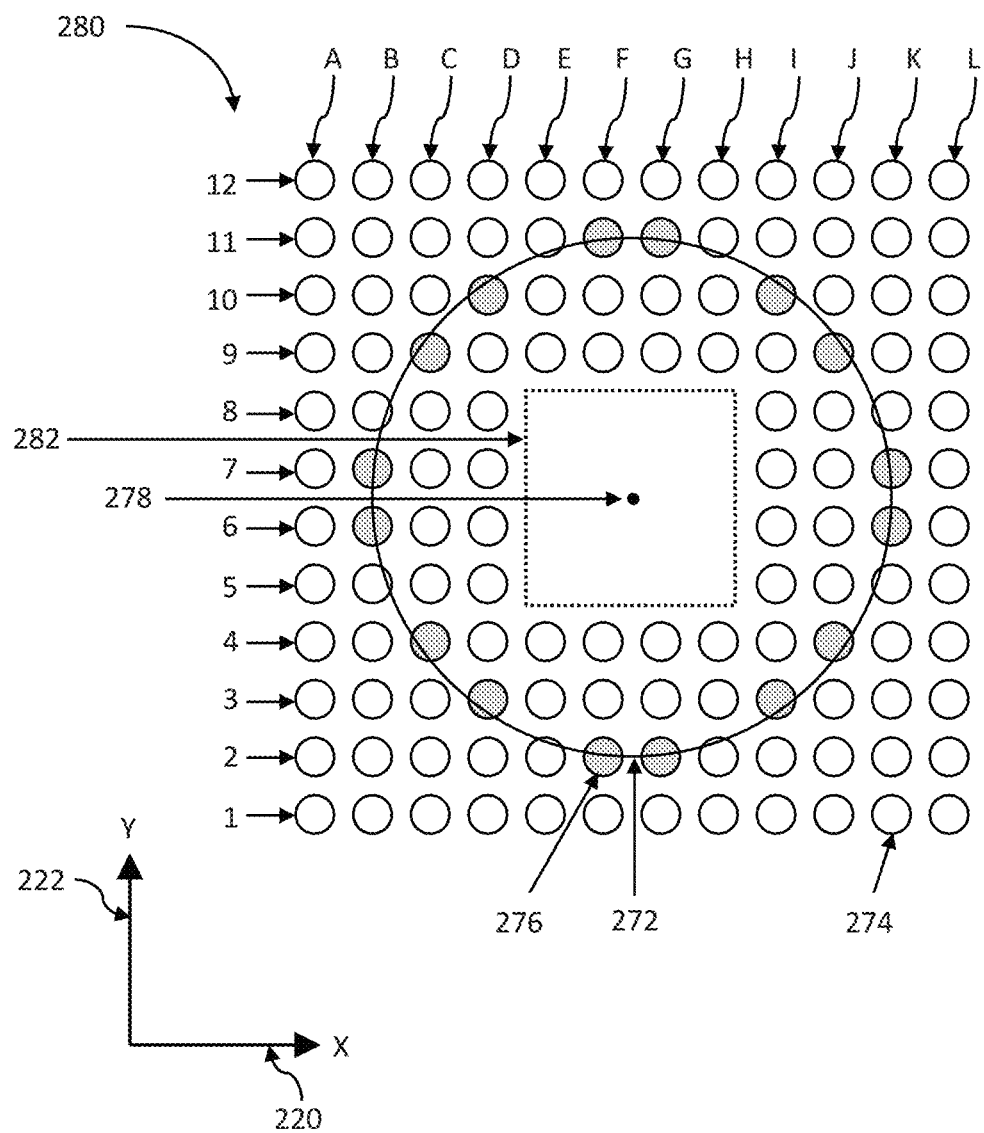

FIG. 19 is a schematic top view of a PMUT array 280. Array 280 is identical to array 270 except that sixteen PMUT transmitters near the central point 278 have been removed. The PMUT transmitters are missing from central area 282 corresponding to columns E, F, G, and H, and rows 5, 6, 7, and 8. Accordingly, the total number of PMUTs is 128, of which 112 are PMUT transmitters 274 and 16 are PMUT receivers 276. The PMUT receivers number less than the PMUT transmitters. Note that the array 280 has a square outer perimeter. Central area 282 which is devoid of PMUTs can be used as space for interconnect vias in the MEMS portion 134 (FIG. 3).

Figure 20:
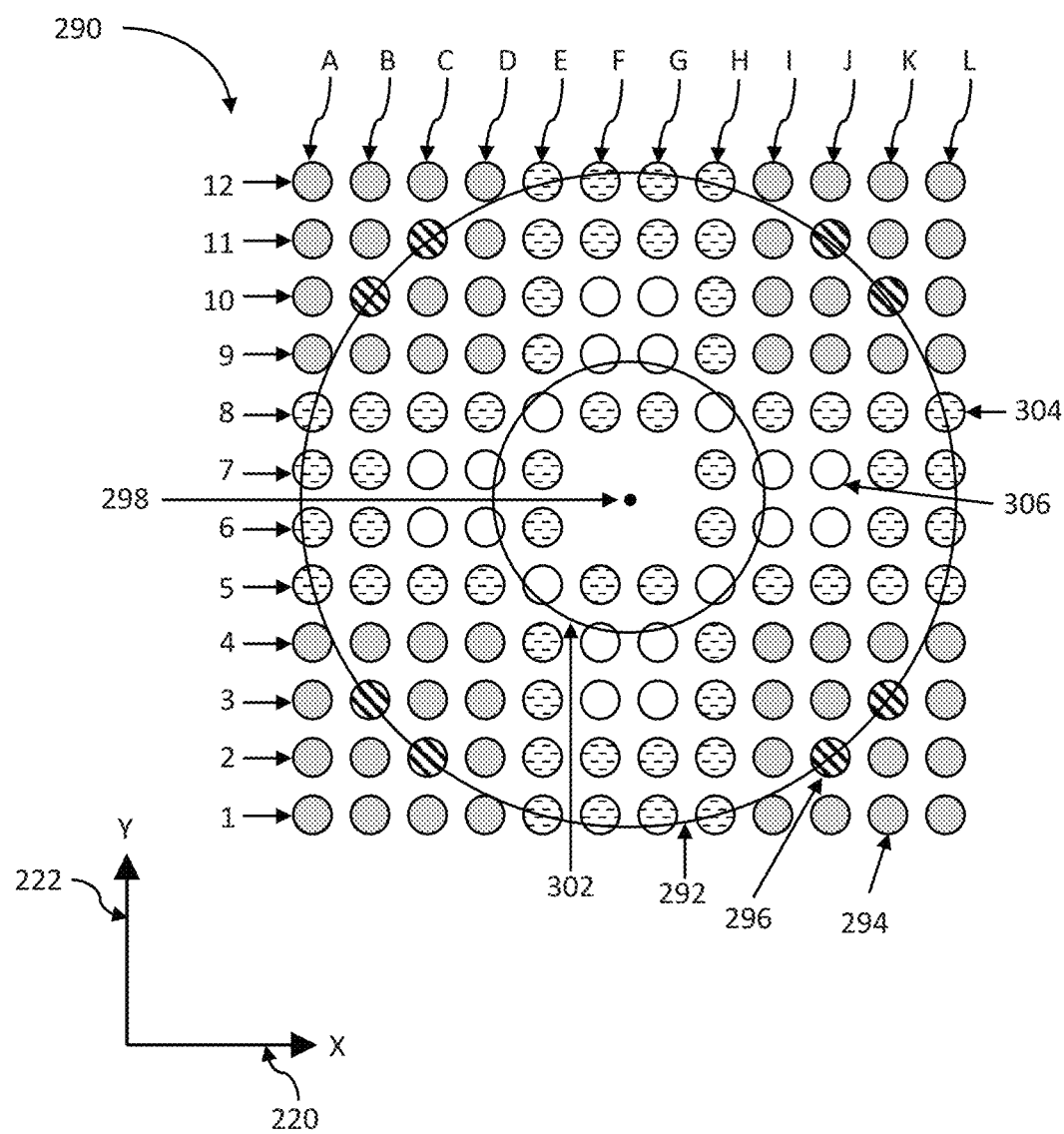
Figure 21:
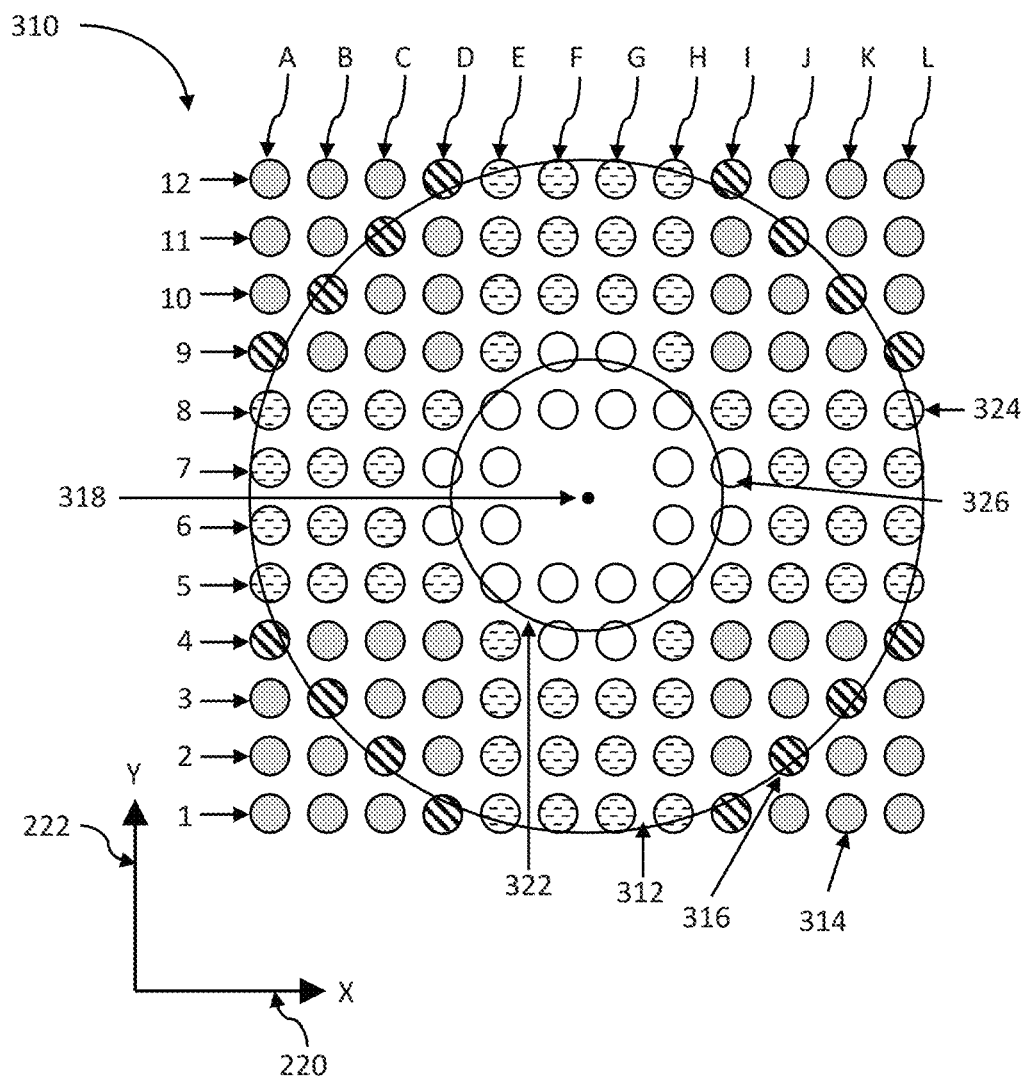
Figure 22:
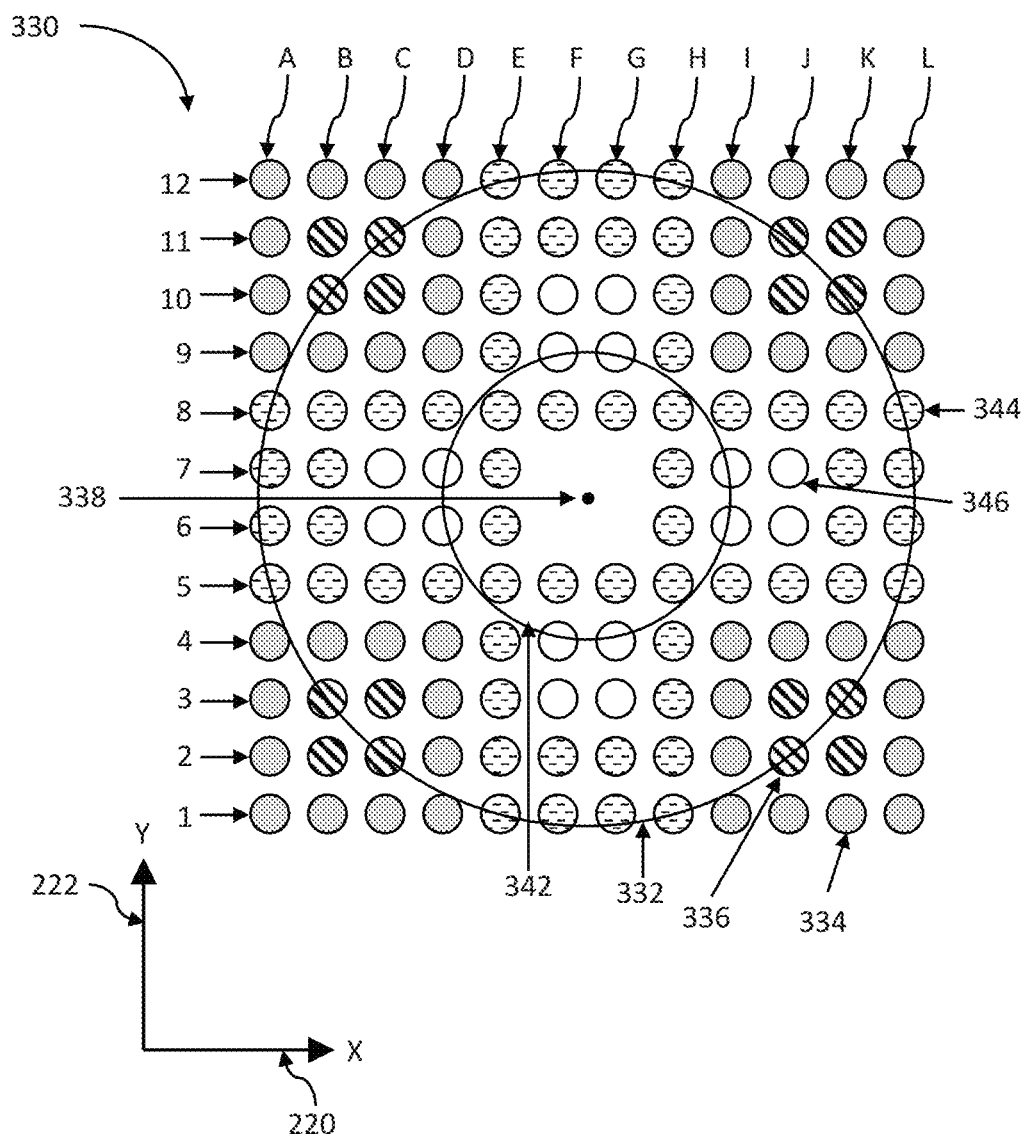

The PMUT arrays shown in FIGS. 15, 16, 17, 18, and 19 illustrate examples of PMUT arrays configured to operate at a single frequency $F_1$, in which the PMUT transmitters transmit ultrasound signals at $F_1$ and the PMUT receivers are configured to receive ultrasound signals at frequency $F_1$. FIGS. 20, 21, and 22 are schematic top views of PMUT arrays that are configured to operate at frequencies $F_1$ and $F_2$. In each of FIGS. 20, 21, and 22, a PMUT array (290, 310, 330) contains first PMUT transmitters (294, 314, 334, shown as grey circles) configured to transmit ultrasound signals at a first frequency $F_1$, first PMUT receivers (296, 316, 336, shown as diagonal hatch-patterned circles) configured to receive ultrasound signals at a first frequency $F_1$, second PMUT transmitters (304, 324, 344, shown as horizontal hatch-patterned circles) configured to transmit ultrasound signals at a second frequency $F_2$, and second PMUT receivers (306, 326, 346, shown as white circles) configured to receive ultrasound signals at a second frequency $F_2$. In each of FIGS. 20, 21, 22, PMUTs are missing from a central area corresponding to columns F and G and rows 6 and 7. The counts of the first PMUT transmitters, first PMUT receivers, second PMUT transmitters, and the second PMUT receivers are tabulated in Table 1. In each case, the first receivers number less than the first transmitters and the second receivers number less than the second transmitters.

TABLE 1

| FIG. No. | 1st Transmitter | 1st Receiver | 2nd Transmitter | 2nd Receiver | Total |
|---|---|---|---|---|---|
| 20 | 56 | 8 | 56 | 20 | 140 |
| 21 | 48 | 16 | 56 | 20 | 140 |
| 22 | 48 | 16 | 60 | 16 | 140 |

In each of FIGS. 20, 21, and 22, a larger circle (292, 312, 332) and a smaller circle (302, 322, 342) are drawn around a central point (298, 318, 338) of the PMUT array (290, 310, 330) to help identify points that are approximately equidistant from the central point (298, 318, 338). The first transmitters and receivers are contained in the four corner quadrants (4 columns by 4 rows each) remote from the central point, corresponding to columns A, B, C, D, I, J, K, and L and rows 1, 2, 3, 4, 9, 10, 11, 12. The second transmitters and receivers are contained in the remaining space. In the case of FIGS. 20 and 21, all of the first receivers (296, 316) intersect the larger circle (292, 312). Accordingly, the first receivers (296, 316) are approximately equidistant from the central point (298, 318). In the case of FIG. 22, half of the first receivers 336 intersect the larger circle 332, and another half of the first receivers 336 are adjacent to other first receivers 336 that intersect the larger circle 332. Accordingly, the first receivers 336 are approximately equidistant from the central point 338. In each of FIGS. 20, 21, and 22, the second receivers (306, 326, 346) intersect the smaller circle (302, 322, 342) or are adjacent to other second receivers (306, 326, 346) that intersect the smaller circle (302, 322, 342). Accordingly, the second receivers (306, 326, 346) are approximately equidistant from the central point (298, 318, 338). On average, the second receivers (306, 326, 346) are closer than the first receivers (296, 316, 336) to the central point (298, 318, 338) of the PMUT array (290, 310, 330).

If the cover layer 120 is at room temperature (approximately 25° C.) and a human finger (approximately 37° C.) touches it at the sense region 126, temperatures in the sense region 126 and surrounding areas, including the FMTSICs (102, 106), might increase. There is likely to be temperature-induced drift in the ultrasound signal measured at the PMUT receivers. In order to reduce the effect of this temperature-induced drift, it is preferable to operate the PMUT transmitters and PMUT receivers at two different frequencies $F_1$ and $F_2$, because the temperature-dependent drift characteristics will be different at different frequencies $F_1$ and $F_2$. Both frequencies $F_1$ and $F_2$ are preferably in a range of 0.1 MHz to 25 MHz. In order to minimize temperature-induced drift, the frequencies $F_1$ and $F_2$ are preferably sufficiently different from each other such that the temperature-dependent drift characteristics will be sufficiently different from each other. On the other hand, suppose that the first transmitters operate at a first central frequency $F_1$ with a bandwidth $\Delta F_1$, and the second transmitters operate at a second central frequency $F_2$ with a bandwidth $\Delta F_2$, with $F_1 < F_2$. If the frequencies and bandwidths are selected such that $F_1 + \Delta F_1/2$ is greater than $F_2 - \Delta F_2/2$ (the first and second bands overlap), then the power transmitted by the first and second transmitters will be additive. Accordingly, there are operational advantages to selecting the frequencies $F_1$ and $F_2$ to be sufficiently close to each other.

Figure 23:
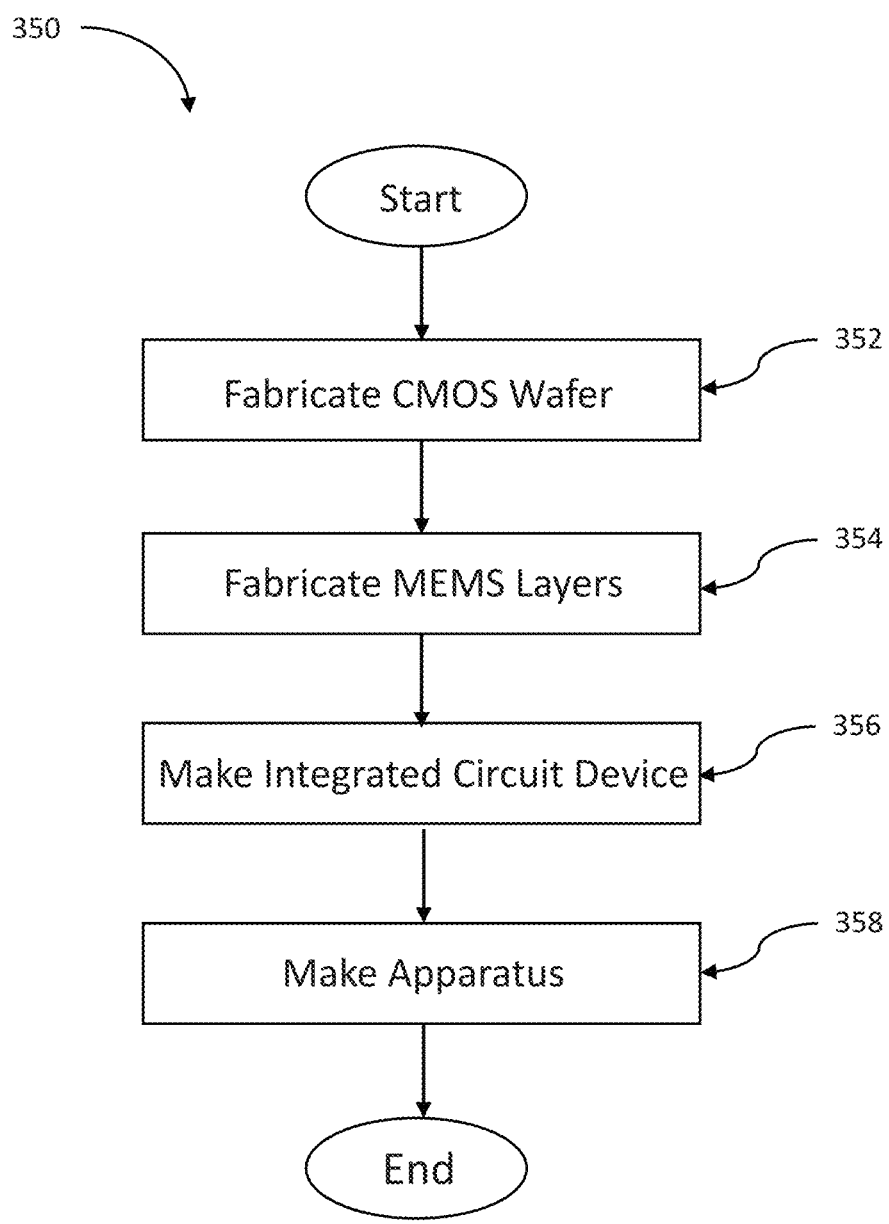
FIG. 23 is a flow diagram of a process of making an integrated circuit device and an apparatus according to the present invention.

FIG. 23 shows a flow diagram 350 for the process of making an FMTSIC device 20 and an apparatus 100. The method includes steps 352, 354, 356, and 358. At step 352, the ASIC portion 136 including signal processing circuitry 137 is fabricated on a semiconductor substrate (wafer) 150 using a CMOS fabrication process. At step 354, the MEMS portion 134 is fabricated on top of the ASIC portion 136. At step 356, the integrated circuit device, FMTSIC 20, is made. This step 356 includes, for example, the singulation of the wafer into dies, the mounting of dies onto a package substrate, and the packaging of the die including application of an epoxy adhesive. The making of FMTSICs is complete at the end of step 356. Subsequently, an apparatus is made at step 358.

For example, the apparatus can be a mobile appliance (e.g., Smartphone, tablet computer, laptop computer), a household appliance (e.g., washing machine, drier, light switches, air conditioner, refrigerator, oven, remote controller devices), a medical appliance, an industrial appliance, an office appliance, an automobile, or an airplane, or a component of any of the above. This step 358 includes, for example, the mounting of one or more FMTSIC devices and other ICs to a flexible circuit substrate and/or printed circuit board (PCB) and adhering the FMTSIC devices to an interior surface of a cover layer of the apparatus.

Step 358 may include a testing procedure carried out on PMFE(s) after adhering the FMTSIC device(s) to the interior surface of the cover layer. This testing procedure preferably includes the application of a testing force, in a range of 0.5 N to 10 N at the sense region. For example, suppose that upon application of a testing force of 7.5 N, a magnitude of the PMFE digital data (difference between maximum PMFE digital data (e.g., 1042 in FIG. 37) and minimum PMFE digital data (e.g., 1044 in FIG. 38)) is 1280 LSB. It is possible to calculate one or both of the following: (1) a ratio A of a magnitude of the PMFE digital data to a physical force value; and/or (2) a ratio B of a physical force value to a magnitude of the PMFE digital data. In this example, the ratio A=1280 LSB/7.5 N and the ratio B=7.5 N/1280 LSB. These ratios A and B permit a conversion between PMFE digital data (expressed in LSB) and a physical force value (expressed in Newtons). These ratios A and/or B can be stored in a memory store (non-volatile memory) of the respective FMTSIC device.

Step 358 may include a testing procedure carried out on PMUT(s) after adhering the FMTSIC device(s) to the interior surface of the cover layer. This testing procedure preferably includes contacting an object to the sense region (touch event) in which a force, in a range of 0.5 N to 10 N, is applied at the sense region. For example, suppose that upon contacting an object in which a testing force of 7.5 N is applied, the PMUT digital data decrease by 230 LSB (e.g., from the baseline 926 to a minimum signal 930 in FIG. 36). Accordingly, the dynamic range (difference between baseline and minimum signal) is 230 LSB under application of a testing force of 7.5 N. These dynamic range and testing force data can be stored in a memory store (non-volatile memory) of the respective FMTSIC device.

Figure 24:
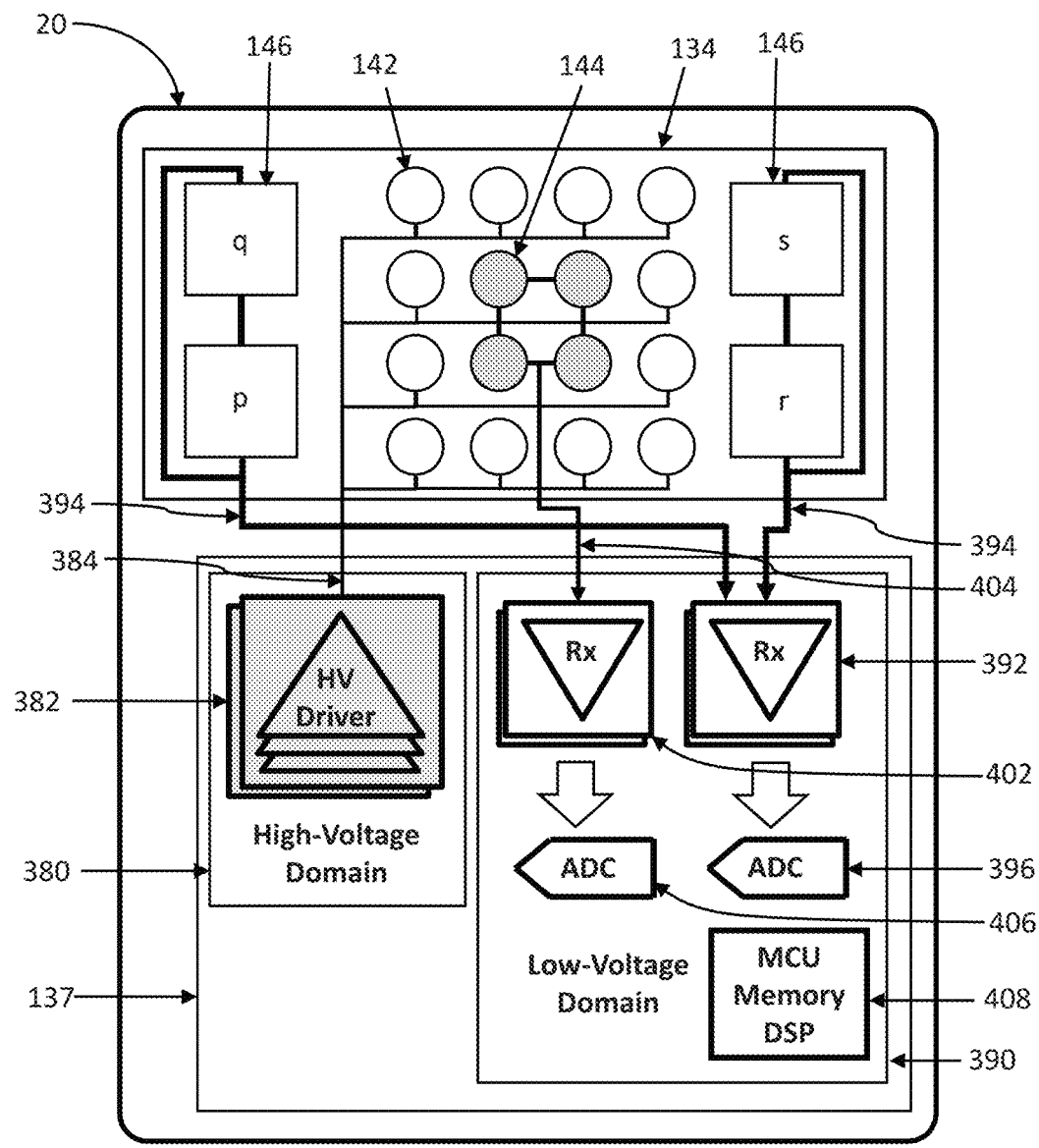
FIG. 24 is an electronics block diagram of a force-measuring, touch-sensing integrated circuit device according to the present invention.

FIG. 24 is an electronics block diagram of the FMTSIC device 20, including a MEMS portion 134 and signal processing circuitry 137. The MEMS portion includes PMUT transmitters 142, PMUT receivers 144, and PMFEs 146. Signal processing circuitry 137 includes a high-voltage domain 380 and a low-voltage domain 390. The high-voltage domain is capable of operating at higher voltages required for driving the PMUT transmitters. The high-voltage domain includes high-voltage transceiver circuitry 382, including high-voltage drivers. The high-voltage transceiver circuitry 382 is connected to the first PMUT electrodes and the second PMUT electrodes of the PMUT transmitters, via electrical interconnections (wiring) 384. The high-voltage transceiver is configured to output voltage pulses of 5 V or greater, depending on the requirements of the PMUT transmitters. The processing circuit blocks 408 are electrically connected to the high-voltage transceiver circuitry 382 and the ADCs (396, 406). The processing circuit blocks 408 generate time-varying signals that are transmitted to the high-voltage transceiver circuitry 382.

The high-voltage transceiver circuitry 382 transmits high-voltage signals to the PMUT transmitters 142 in accordance with the time-varying signals from the processing circuit blocks 408.

The low-voltage domain 390 includes amplifiers (392, 402) and analog-to-digital converters (ADCs) (396, 406). The processing circuit blocks 408 are also contained in the low-voltage domain 390. Voltage signals output by the PMUT receivers 144 (represented by gray circles) reach amplifiers 402 via electrical interconnections (wiring) 404 and get amplified by the amplifiers 402. The amplified voltage signals are sent to ADC 406 to be converted to digital signals which can be processed or stored by processing circuit blocks 408. Similarly, voltage signals output by PMFEs 146 reach amplifiers 392 via electrical interconnections (wiring) 394 and get amplified by the amplifiers 392. These amplified voltage signals are sent to ADC 396 to be converted to digital signals which can be processed or stored by processing circuit blocks 408. The processing circuit blocks 408 could be microcontrollers (MCUs), memories, and digital signal processors (DSPs), for example. The wiring (384, 394, 404) traverses the semiconductor substrate, which contains the signal processing circuitry 137, and the MEMS portion 134, which contains the PMFEs 146, the PMUT transmitters 142, and the PMUT receivers 144.

In the example shown (FIG. 24), the piezoelectric capacitors constituting the PMUT receivers 144 are connected to each other in parallel. Since the capacitances of these PMUT receivers are added together, this arrangement of PMUT receivers is less sensitive to the effects of parasitic capacitance. Accordingly, there is a unified voltage signal transmitted from the PMUT receivers 144 to the amplifiers 402. The piezoelectric capacitors constituting the PMUT transmitters 142 are connected in parallel. Accordingly, there is a time-varying signal transmitted from the high-voltage transceiver circuitry 382 to the PMUT transmitters 142. The PMFEs 146 are grouped into two sets (p and q on the left side, r and s on the right side), and the PMFEs in each set are connected to each other in series. Accordingly, there are two sets of PMFE signals transmitted from the PMFEs 146 to the amplifiers 392.

Figure 25:
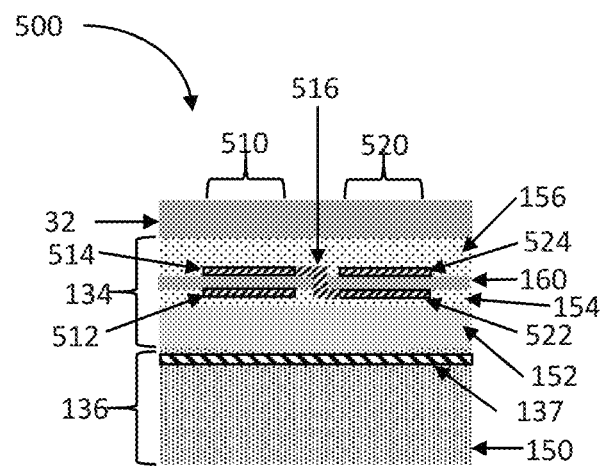
FIG. 25 is a schematic cross-sectional view of a set (pair) of piezoelectric micromechanical force-measuring elements (PMFEs).

FIG. 25 is a schematic cross-sectional view of a set 500 of PMFEs 510 and 520. Also shown is the ASIC portion 136 that is under the PMFEs 510, 520 and the encapsulating adhesive 32 that is above the PMFEs 510 and 520. FIG. 25 shows the PMFE in a quiescent state analogous to the quiescent state described with reference to FIG. 11. A PMFE was described with reference to FIG. 11. In the example shown, the piezoelectric stack includes a piezoelectric layer 160, a top mechanical layer 156, and a bottom mechanical layer 154. In a deformed state (shown in FIGS. 12, 13, and 14, for example), an electrical charge is generated between the PMFE electrodes 512 and 514 of first PMFE 510 and between the PMFE electrodes 522 and 524 of the second PMFE 520.

Figure 26:
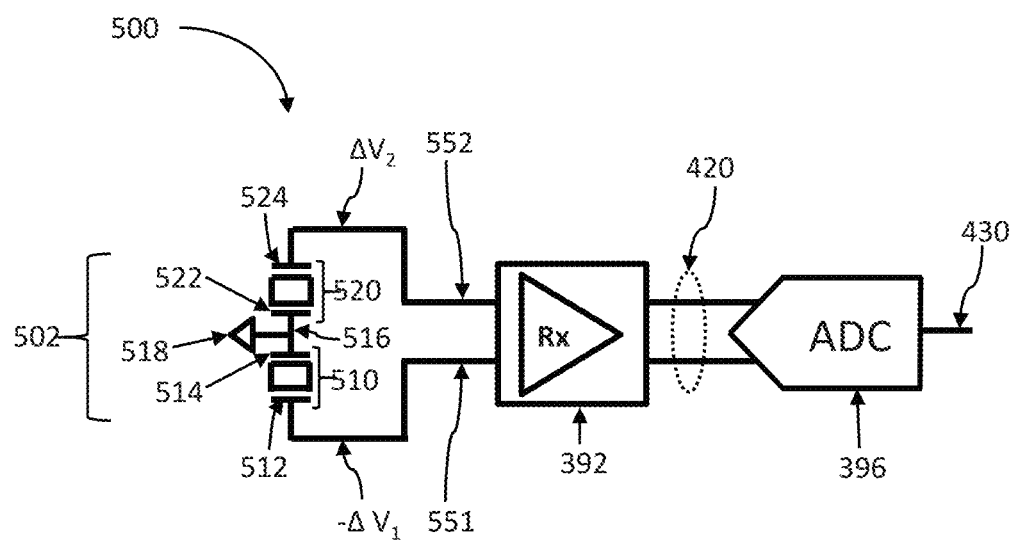
FIG. 26 is a block diagram illustrating the electrical connections of the PMFE pair of FIG. 25 to related signal processing circuitry in an integrated circuit device according to the present invention.

For each PMFE (510, 520), the first PMFE electrode (512, 522), the second PMFE electrode (514, 524), and the piezoelectric layer 160 between them constitute a piezoelectric capacitor. FIG. 26 is a block diagram illustrating the electrical connections of the PMFE set (pair) to certain portions of the signal processing circuitry 137. In FIG. 26, we illustrate each PMFE (510, 520) as a piezoelectric capacitor. PMFEs 510 and 520 are connected in series via a wire 516 that includes a via that penetrates the piezoelectric layer 160 (FIG. 25). Wire 516 connects second electrode (top electrode) 514 of first PMFE 510 to the first electrode (bottom electrode) 522 of the second PMFE 512. The outermost electrodes of the PMFE electrodes in the series 502 are first electrode 512 of the first PMFE 510 and the second electrode 524 of the second PMFE 520. These outermost electrodes of the first PMFE electrodes and the second PMFE electrodes of the PMFEs in the series 502 are connected as differential inputs 551, 552 to the amplifier circuitry 392 of the signal processing circuitry 137. The voltage signals at inputs 551, 552 are amplified by the amplifier circuitry 392. Amplified voltage signals 420 are output from the amplifier circuitry 392 to the analog-to-digital converter (ADC) 396. Digital signals 430 are output from the ADC 396.

As shown in the example of FIG. 26, wire 516 is tied to a common node 518. In this case, we can refer to the node between the two adjacent PMFEs 510, 520 connected in series as a common node. If the voltage of the common node is held at 0 V, the voltage signal input to input 551 can be expressed as $-\Delta V_1$, and the voltage signal input to input 552 can be expressed as $\Delta V_2$, where the subscripts refer to the first PMFE (510) or second PMFE (520). An advantage of a node between adjacent PMFEs connected in series being a common node is that voltage offsets from the common node voltage are reduced, simplifying subsequent amplification of low-voltage signals.

Figure 27:
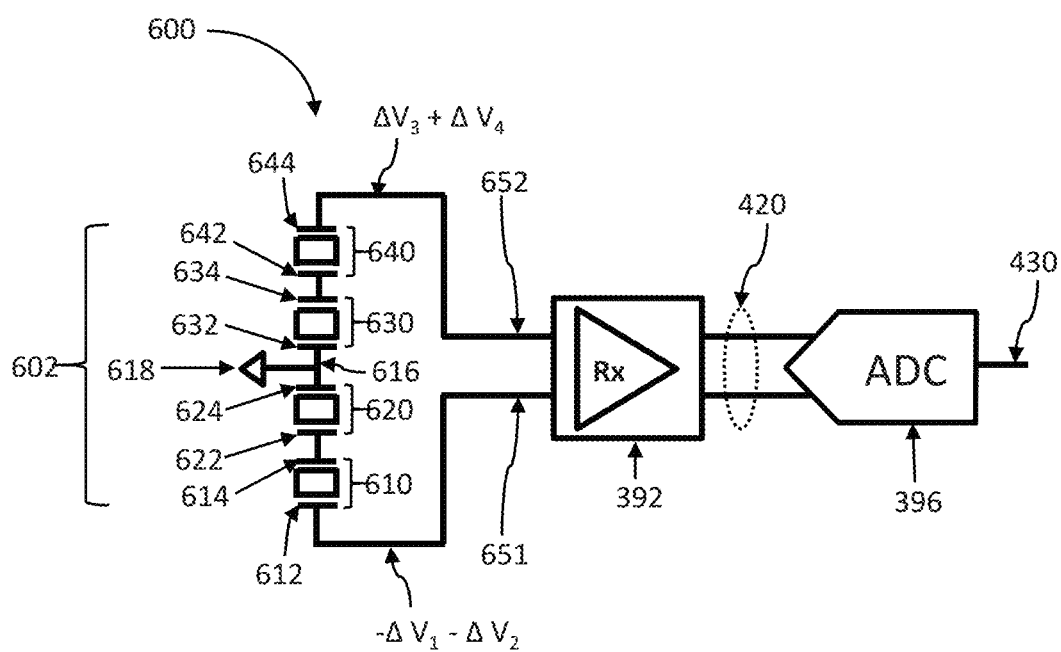
FIG. 27 is a block diagram illustrating the electrical connections of a set of PMFEs to related signal processing circuitry in an integrated circuit device according to the present invention.

FIG. 27 is a block diagram illustrating the electrical connections of a PMFE set (600) to certain portions of the signal processing circuitry 137. FIG. 27 is similar to FIG. 26 except that there are four PMFEs in the set and these four PMFEs are connected in series. The second electrode 614 of the first PMFE 610 is connected to the first electrode 622 of the second PMFE 620, the second electrode 624 of the second PMFE 620 is connected to the first electrode 632 of the third PMFE 630, and the second electrode 634 of the third PMFE 630 is connected to the first electrode 642 of the fourth PMFE 640. The outermost electrodes of the PMFE electrodes in the series 602 are first electrode 612 of the first PMFE 610 and the second electrode 644 of the fourth PMFE 640. These outermost electrodes of the PMFE electrodes in the series 602 are connected as differential inputs 651, 652 to the amplifier circuitry 392 of the signal processing circuitry 137. The voltage signals at inputs 651, 652 are amplified by the amplifier circuitry 392. Amplified voltage signals 420 are output from the amplifier circuitry 392 to the analog-to-digital converter (ADC) 396. Digital signals 430 are output from the ADC 396.

Wire 616 connects the second electrode 624 of the second PMFE 620 to the first electrode 632 of the third PMFE 630. Wire 616 is tied to a common node 618. If the voltage of the common node is held at 0 V, the voltage signal input to input 651 can be expressed as $-\Delta V_1 - \Delta V_2$, and the voltage signal input to input 652 can be expressed as $\Delta V_3 + \Delta V_4$, where the subscripts refer to the first PMFE (610), second PMFE (620), third PMFE (630), and fourth PMFE (640).

Figure 28:
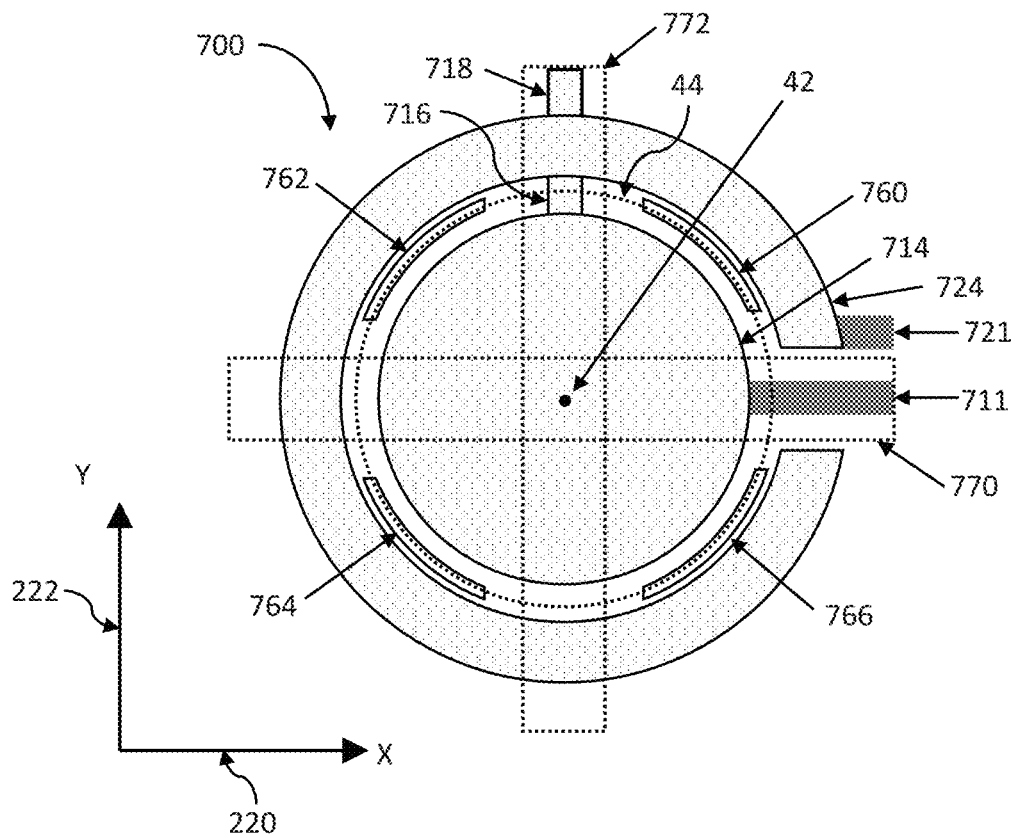
FIG. 28 is a schematic top view of a PMUT showing an outer electrode and release holes.

FIG. 28 is a schematic top view of a PMUT 700, including a second PMUT electrode (top PMUT electrode) 714, shown as a dark grey circular region centered around a central point 42. An inflection line 44 of the thin-film piezoelectric stack is shown is shown as a circle centered around the central point 42, located outside of the top PMUT electrode 714. Inflection line 44 is analogous to the inflection point 44A, 44B discussed in the context of the cross-sectional view of the piezoelectric stack (FIG. 4). Since the strain changes sign (positive to negative or negative to positive) upon laterally traversing the inflection line 44, it is preferable that the first PMUT electrode and the second PMUT electrode be located inside the inflection line. In the example shown, the top PMUT electrode (second PMUT electrode) is located within the inflection line (circle) 44. The bottom PMUT electrode (first PMUT electrode), which is hidden behind the top PMUT electrode, is also located within the inflection line (circle) 44.

During the fabrication of the MEMS layers (step 354 of FIG. 23), cavities are formed between the thin-film piezoelectric stack and the semiconductor substrate at lateral positions corresponding to the PMUTs. These cavities can be formed by dry etching process after the formation of subsequent layers, such as the layers in the thin-film piezoelectric stack. In order to carry out this dry etching process, release holes should be formed for each cavity. The release holes are holes through which etchants can enter the cavity and spent etchants and etched material can exit from the cavity. The release hole for a cavity is connected to the cavity and extends through the thin-film piezoelectric stack. It is preferable that the release holes overlap the inflection line where the strain in the piezoelectric stack is 0. In the example shown in FIG. 28, there are four release holes (760, 762, 764, 766). These release holes overlap the inflection line 44. When we refer to a first object overlapping a second object, it is not necessary that the entirety of the second object be covered by the first object. Moreover, the release holes and the first and second PMUT electrodes are positioned relative to each other such that the release holes do not extend through the first PMUT electrode and the second PMUT electrode.

The PMUT 700 of FIG. 28 additionally includes an outer piezoelectric capacitor. The second outer PMUT electrode (top outer PMUT electrode) 724 is shown as a C-shaped ring located outside the inflection line 44. The first outer PMUT electrode (bottom outer PMUT electrode), which is hidden behind the top outer PMUT electrode, is also located outside the inflection line (circle) 44. The first outer PMUT electrode and the second outer PMUT electrode are positioned on opposite sides of the piezoelectric layer to constitute an outer piezoelectric capacitor. The release holes and the first and second outer PMUT electrodes are positioned relative to each other such that the release holes do not extend through the first outer PMUT electrode and the second outer PMUT electrode.

Figure 29:
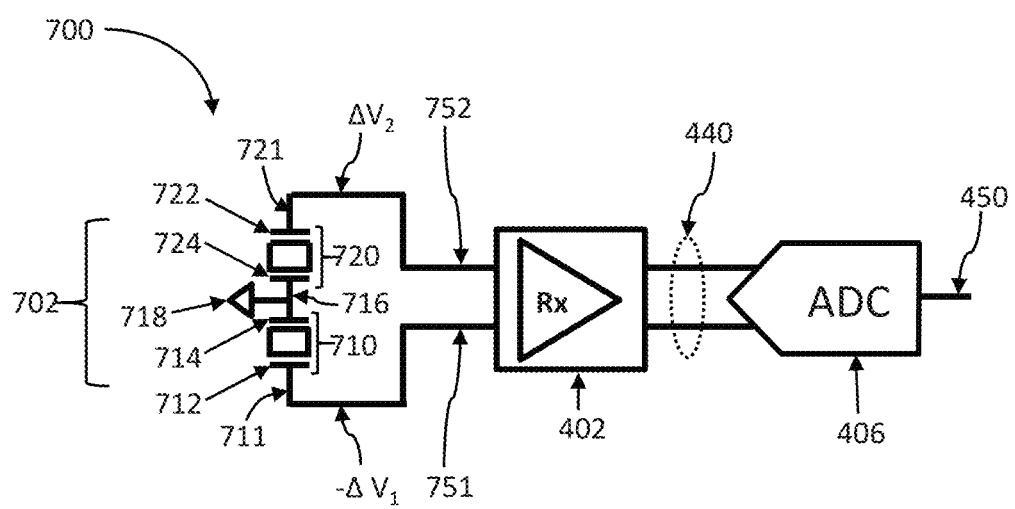
FIG. 29 is a block diagram illustrating the electrical connections of the PMUT of FIG. 26 to related signal processing circuitry in an integrated circuit device according to the present invention.

PMUT 700 can be configured as a receiver (PMUT receiver). FIG. 29 is a block diagram illustrating the electrical connections of PMUT 700. In FIG. 29, piezoelectric capacitor 710 (containing first PMUT electrode 712 and second PMUT electrode 714) and outer piezoelectric capacitor 720 (containing first outer PMUT electrode 722 and second outer PMUT electrode 724) are connected in series 702 via a wiring trace 716. In the example shown, wiring trace 716 is located at 12 o'clock. The wiring trace 716 connects the top outer PMUT electrode 724 and the top PMUT electrode 714. Hence the wiring trace 716 does not penetrate the piezoelectric layer. Wiring trace 718 which is connected to the top outer PMUT electrode 724 (12 o'clock) is connected to the common node. In the example shown, the wiring traces 716, 718, the top outer PMUT electrode 724, and the top PMUT electrode 714 are contained in the same metal layer. The outermost electrodes of the PMUT electrodes in series 702 are first PMUT electrode 712 and the first outer PMUT electrode 722. These outermost electrodes are connected as differential inputs 751, 752 to the amplifier circuitry 402 of the signal processing circuitry 137. The voltage signals at inputs 751, 752 are amplified by the amplifier circuitry 402. Amplified voltage signals 440 are output from the amplifier circuitry 402 to the analog-to-digital converter (ADC) 406. Digital signals 450 are output from the ADC 406. When configured as a receiver, the PMUT 700 is sometimes referred to as a differential PMUT receiver. PMUT 700, when configured as a receiver, can be substituted for any of the PMUT receivers that do not have outer electrodes. For example, PMUT 700, when configured as a receiver, can be substituted for any of the PMUT receivers in the arrays of FIGS. 15, 16, 17, 18, 19, 20, 21, and 22.

As shown in FIG. 28, a wiring trace 711 is connected to the bottom PMUT electrode (first PMUT electrode) 712. Wiring trace 711 extends to the signal processing circuitry, in particular the input 751 of the amplifier circuitry 402. A wiring trace 721 is connected to the bottom outer PMUT electrode (first outer PMUT electrode) 722. Wiring trace 721 extends to the signal processing circuitry, in particular the input 752 of the amplifier circuitry 392. In the example shown, the wiring traces 711, 721, the bottom outer PMUT electrode 722, and the bottom PMUT electrode 712 are contained in the same metal layer. The first and second outer PMUT electrodes should preferably be shaped to enable wiring connections to the first and second PMUT electrodes. In the example shown, a region of overlap of the first outer PMUT electrode 722 and the second outer PMUT electrode 724 is a C-shaped ring to accommodate the wiring trace 711 connecting the first PMUT electrode to the signal processing circuitry. In the example shown in FIG. 28, PMUT 700 include a first wiring corridor 770 and a second wiring corridor 772. These wiring corridors 770, 772 traverse the inflection line 44. Wiring trace 711 is contained in a first wiring corridor 770 which extends along the X-direction 220. The first outer PMUT electrode 722 and the second PMUT electrode 724 are shaped such that they do not overlap the first wiring corridor 770. A second wiring corridor 772, perpendicular to the first wiring corridor 770, extends along the Y-direction 222. Wiring trace 716 which is connected to the second PMUT electrode 714 is contained in the second wiring corridor 772. The release holes (760, 762, 764, 766) are shaped and oriented such that they do not overlap the first wiring corridor 770 and the second wiring corridor 772. The release holes are shaped and oriented such that they do not extend through any wiring that is connected to the first PMUT electrode 712 or the second PMUT electrode 714.

Figure 30:
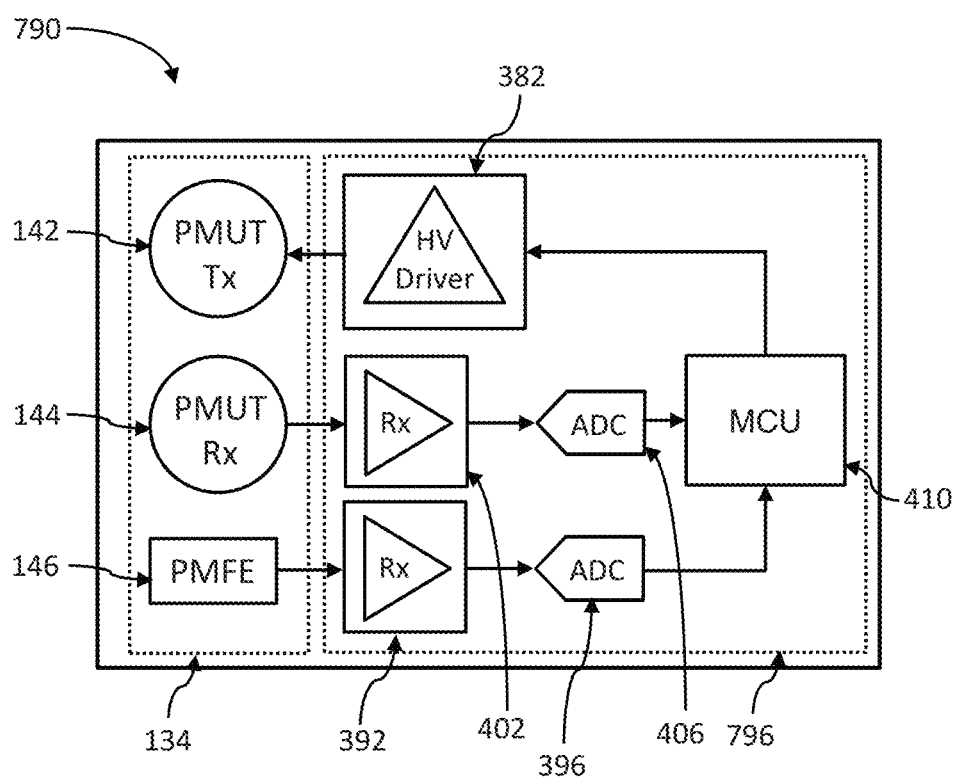
FIGS. 30, 31, 32, 33, and 34 are block diagrams of different implementations of force-measuring, touch-sensing integrated circuit devices and associated circuitry.

FIG. 30 is a block diagram of the FMTSIC device 790, which is an example of a force-measuring and touch-sensing system integrated into a single integrated circuit device. FMTSIC device 790 includes a MEMS portion 134 and an ASIC portion 796. The MEMS portion 134 includes PMUT transmitters 142, PMUT receivers 144, and PMFEs 146. The ASIC portion includes the following signal processing circuitry: high-voltage transceiver circuitry 382, including high-voltage drivers, amplifiers (392, 402), analog-to-digital converters (ADCs) (396, 406), and a microcontroller (MCU) 410. The high-voltage transceiver circuitry 382 is operatively coupled to the first PMUT electrodes and the second PMUT electrodes of the PMUT transmitters 142. The high-voltage transceiver is configured to output voltage pulses of 5 V or greater, depending on the requirements of driving the PMUT transmitters. There may be additional signal processing circuitry located on-chip (in the ASIC portion) and/or additional signal processing circuitry located off-chip. Such off-chip signal processing circuitry would be operatively coupled to the on-chip signal processing circuitry.

MCU 410 is operatively coupled to the high-voltage transceiver circuitry 382 and the ADCs (396, 406). MCU 410 generates time-varying signals that are transmitted to the high-voltage transceiver circuitry 382. The high-voltage transceiver circuitry 382 transmits high-voltage signals to the PMUT transmitters 142 in accordance with the time-varying signals from MCU 410, causing the PMUT transmitters 142 generate ultrasound waves. Returning ultrasound waves are incident on PMUT receivers 144. Voltage signals are generated at the PMUT receivers in response to ultrasound waves incident thereon. Voltage signals output by the PMUT receivers 144 reach amplifiers 402 (operatively coupled to PMUT receivers 144) and get amplified by the amplifiers 402. These amplified voltage signals are sent to ADC 406 (operatively coupled to the amplifiers 402) to be converted to digital signals (PMUT digital data) which can be processed by MCU 410. Similarly, voltage signals are generated at the PMFEs in response to a mechanical deformation. Voltage signals output by PMFEs 146 reach amplifiers 392 (operatively coupled to PMFEs 146) and get amplified by the amplifiers 392. These amplified voltage signals are sent to ADC 396 (operatively coupled to the amplifiers 392) to be converted to digital signals (PMFE digital data) which can be processed by MCU 410. Data processing and algorithms can be carried out at the MCU (410) using digital data derived from the PMUT receivers 144 and PMFEs 146. In the example shown, the piezoelectric capacitors constituting the PMUT receivers 144 are connected in parallel, and the piezoelectric capacitors constituting the PMUT transmitters 142 are connected in parallel. The PMFEs 146 are grouped into sets, with the PMFEs in each set being connected in series.

Figure 31:
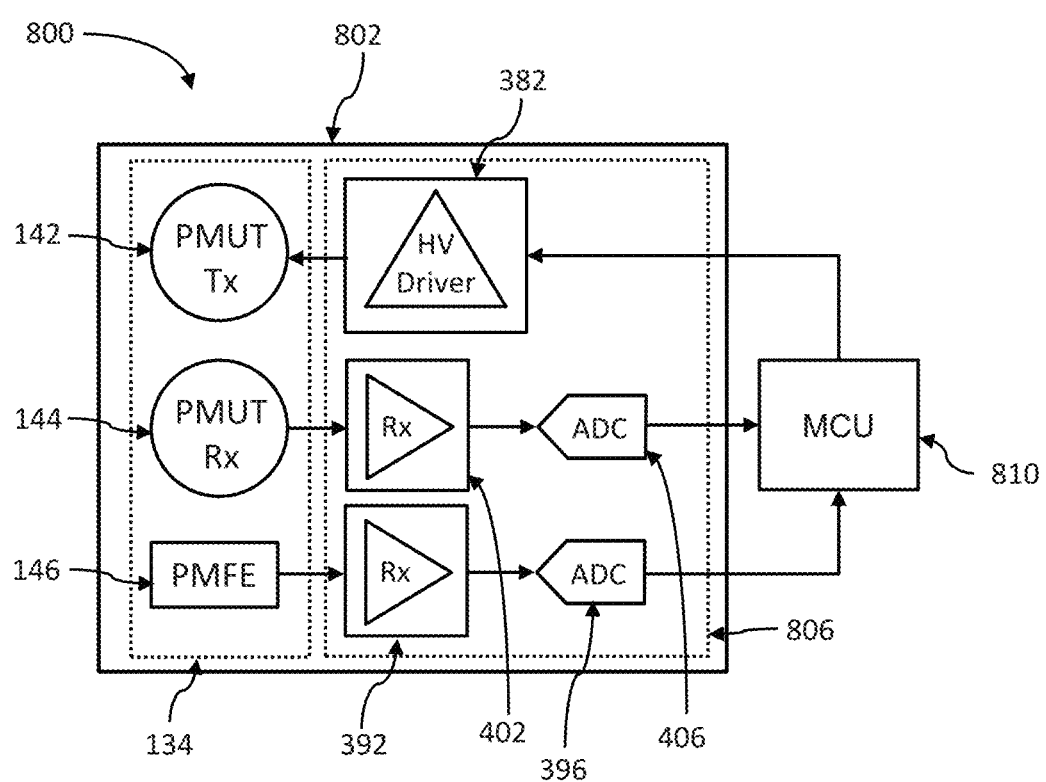

FIG. 31 is a block diagram of an example of a force-measuring and touch-sensing system 800, a portion of which is integrated into an integrated circuit device, namely FMTSIC device 802. The force-measuring and touch-sensing system 800 includes FMTSIC device 802 and an MCU 810. FMTSIC device 802 includes a MEMS portion 134 and an ASIC portion 806. The MEMS portion 134 includes PMUT transmitters 142, PMUT receivers 144, and PMFEs 146. The ASIC portion includes the following signal processing circuitry: high-voltage transceiver circuitry 382, including high-voltage drivers, amplifiers (392, 402), and analog-to-digital converters (ADCs) (396, 406). FMTSIC device 802 is similar to the FMTSIC device 790, except that FMTSIC device 802 does not include an MCU. MCU 810 can be a separate IC such as a commercially available IC. MCU 810 is operatively coupled to the high-voltage transceiver circuitry 382 and the ADCs (396, 406), and can operate similarly to MCU 410 of FIG. 30.

Figure 32:
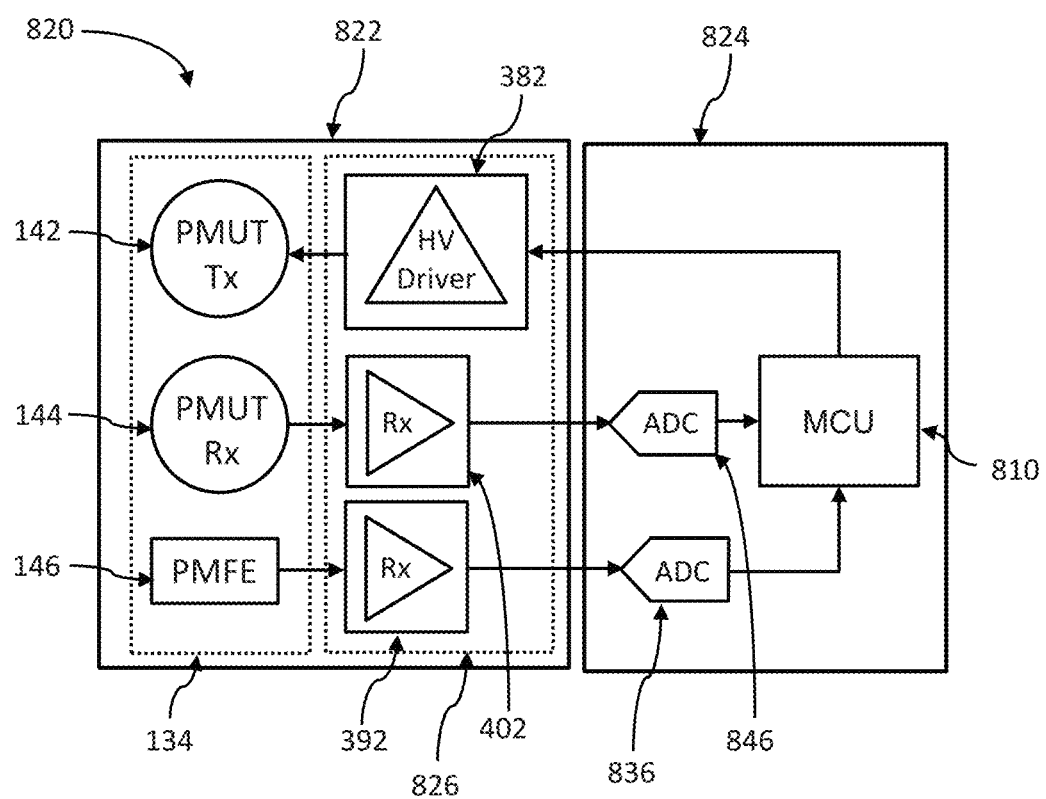

FIG. 32 is a block diagram of an example of a force-measuring and touch-sensing system 820, which includes FMTSIC device 822 and other circuit blocks 824. FMTSIC device 822 includes a MEMS portion 134 and an ASIC portion 826. The MEMS portion 134 includes PMUT transmitters 142, PMUT receivers 144, and PMFEs 146. The ASIC portion includes the following signal processing circuitry: high-voltage transceiver circuitry 382, including high-voltage drivers, and amplifiers (392, 402). The configuration shown in FIG. 32 is similar to that shown in FIG. 31 except that the ADCs are moved from the FMTSIC to the other circuit blocks. Other circuit blocks 824 include MCU 810 and ADCs (836, 846).

In the example shown in FIG. 32, MCU 810 is operatively coupled to the high-voltage transceiver circuitry 382 and the ADCs (836, 846). Voltage signals output by the PMUT receivers 144 reach amplifiers 402 (operatively coupled to PMUT receivers 144) and get amplified by the amplifiers 402. These amplified voltage signals are sent to ADC 846 (operatively coupled to the amplifiers 402) to be converted to digital signals (PMUT digital data) which can be processed by MCU 810. Voltage signals output by PMFEs 146 reach amplifiers 392 (operatively coupled to PMFEs 146) and get amplified by the amplifiers 392. These amplified voltage signals are sent to ADC 836 (operatively coupled to the amplifiers 392) to be converted to digital signals (PMFE digital data) which can be processed by MCU 810. Other circuit blocks 824 can be implemented as an IC. For example, a commercially available MCU can be used as MCU 810, and ADCs in the commercially available MCU can be used as ADCs (836, 846).

Figure 33:
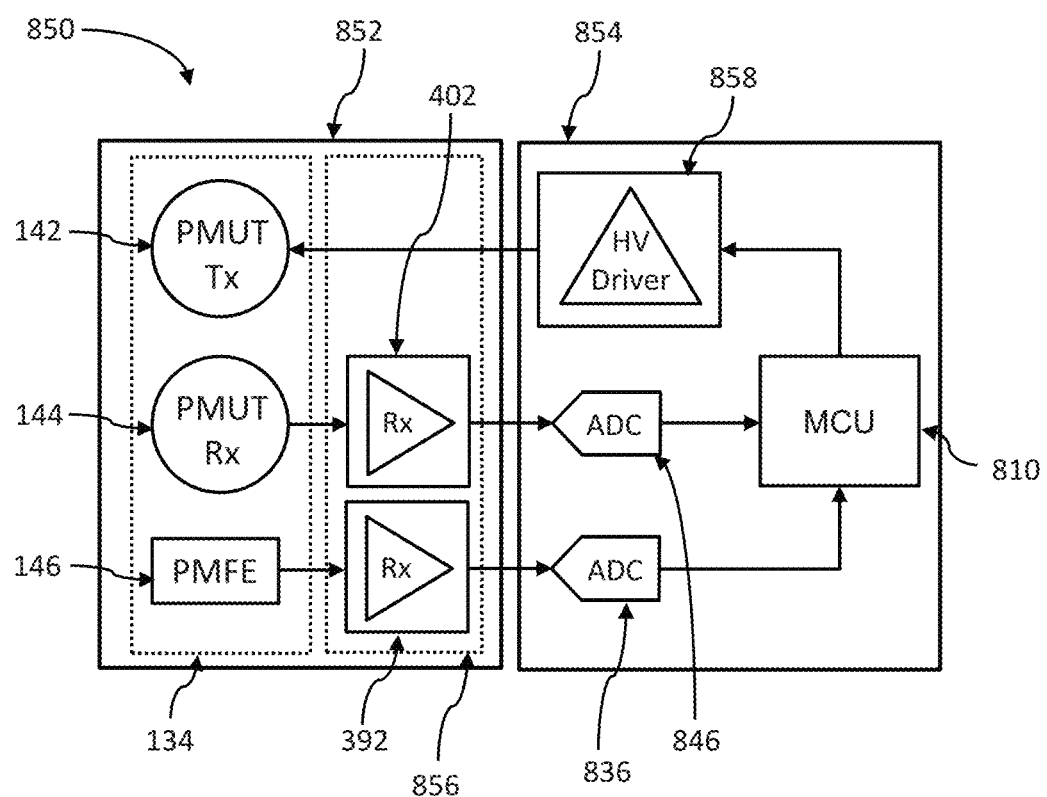

FIG. 33 is a block diagram of an example of a force-measuring and touch-sensing system 850, which includes FMTSIC device 852 and other circuit blocks 854. FMTSIC device 852 includes a MEMS portion 134 and an ASIC portion 856. The MEMS portion 134 includes PMUT transmitters 142, PMUT receivers 144, and PMFEs 146. The ASIC portion includes the following signal processing circuitry: amplifiers (392, 402). The configuration shown in FIG. 33 is similar to that shown in FIG. 32 except that the high-voltage transceiver circuitry are moved from the FMTSIC to the other circuit blocks. Other circuit blocks 854 include MCU 810, ADCs (836, 846), and high-voltage transceiver circuitry 858. MCU 810 is operatively coupled to the high-voltage transceiver circuitry 858. MCU 810 generates time-varying signals that are transmitted to the high-voltage transceiver circuitry 858. The high-voltage transceiver circuitry 858 transmits high-voltage signals to the PMUT transmitters 142.

Figure 34:
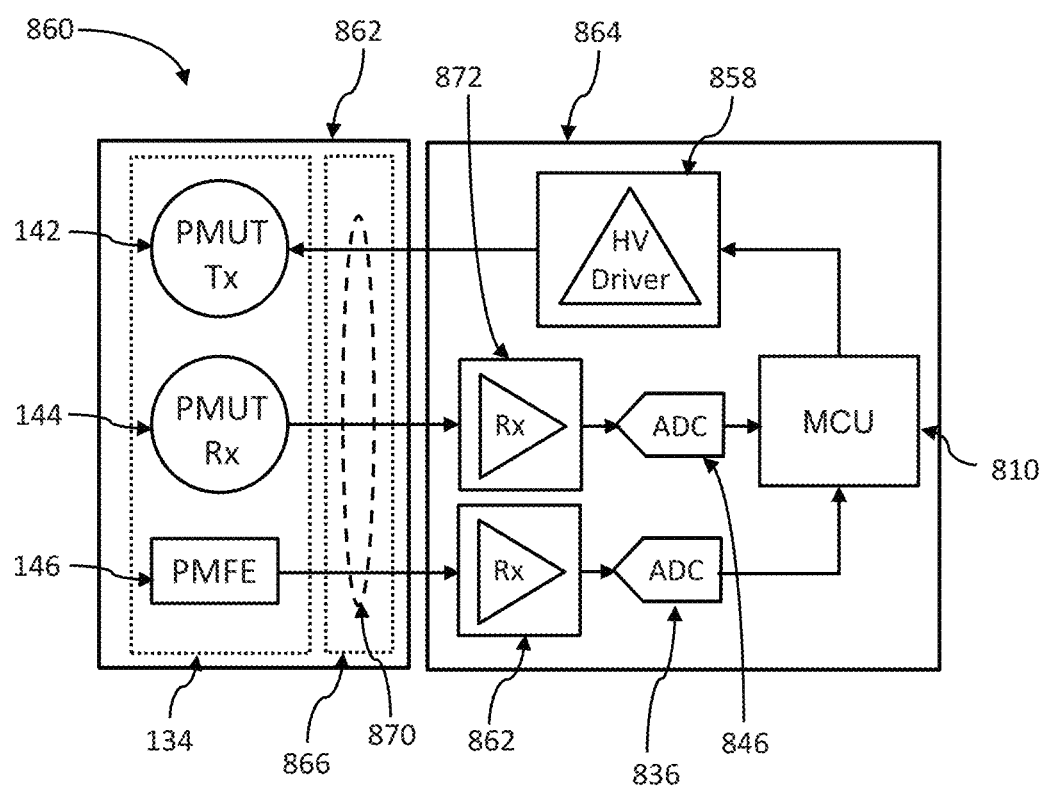

FIG. 34 is a block diagram of an example of a force-measuring and touch-sensing system 860, which includes FMTSIC device 862 and other circuit blocks 864. FMTSIC device 852 includes a MEMS portion 134 and a semiconductor substrate portion 866. The MEMS portion 134 includes PMUT transmitters 142, PMUT receivers 144, and PMFEs 146. The semiconductor substrate portion 866 includes electrical interconnections (wiring) 870 that electrically connect the MEMS portion to the other circuit blocks 864. The configuration shown in FIG. 34 is similar to that shown in FIG. 33 except that the amplifiers are moved from the FMTSIC to the other circuit blocks. Other circuit blocks 864 include MCU 810, ADCs (836, 846), amplifiers (862, 872) and high-voltage transceiver circuitry 858. The high-voltage transceiver circuitry 858 transmits high-voltage signals to the PMUT transmitters 142 via wiring 870. Voltage signals output by the PMUT receivers 144 reach amplifiers 872 which are operatively coupled (via wiring 870) to PMUT receivers 144 and get amplified by the amplifiers 872. These amplified voltage signals are sent to ADC 846 (operatively coupled to the amplifiers 872) to be converted to digital signals (PMUT digital data) which can be processed by MCU 810. Voltage signals output by PMFEs 146 reach amplifiers 862 which are operatively coupled (via wiring 870) to PMFEs 146 and get amplified by the amplifiers 862. These amplified voltage signals are sent to ADC 836 (operatively coupled to the amplifiers 862) to be converted to digital signals (PMFE digital data) which can be processed by MCU 810. The wiring 870 on the semiconductor substrate 866 extends from the semiconductor substrate 866 to the PMUTs (142, 144) and to the PMFEs (146). Other circuit blocks 854 and other off-chip signal processing circuitry are operatively coupled to the MEMS portion 134 via the wiring 870 on the semiconductor substrate 866.

Figure 35:
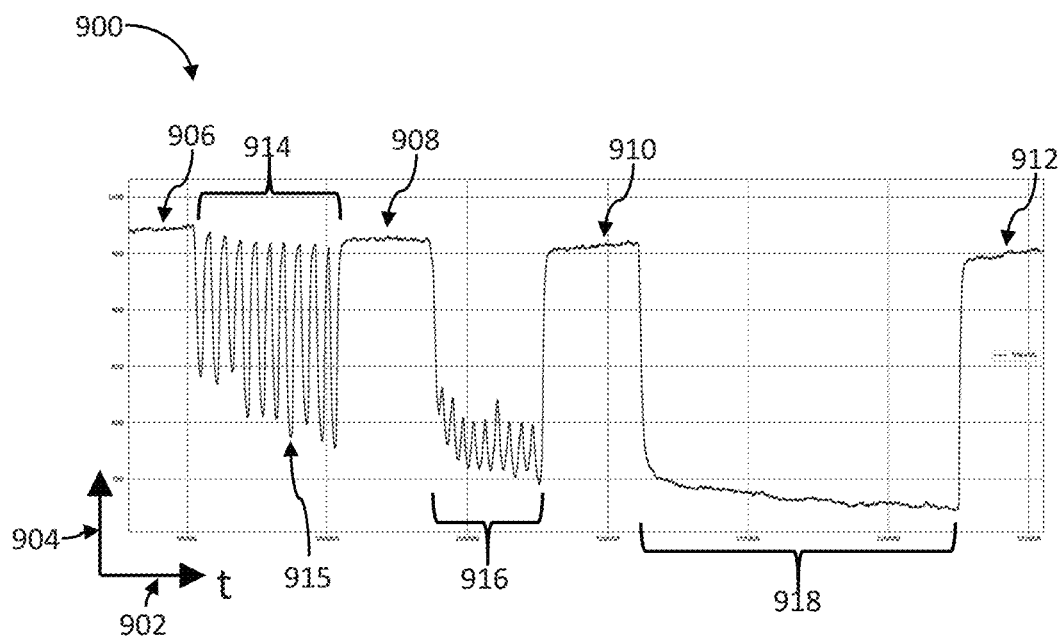
FIG. 35 is a diagram showing a graphical plot of example PMUT digital data over a longer time duration.

An example of a PMUT digital data is shown in FIG. 35, which shows graphical plot 900 of illustrative PMUT digital data, after ADC and before additional processing (e.g., high-pass filtering). The graphical plot has a horizontal axis 902 showing time t, in which 1 division corresponds to 5000 ms, and a vertical axis 904 showing PMUT digital data (e.g., data output from ADC 406 of FIG. 30). Graphical plot 900 includes sections 906, 914, 908, 916, 910, 912, 918, and 912 (ordered sequentially). Graphical plot sections 906, 908, 910, and 912 correspond to time periods during which there is nothing touching or coming into contact with the sense region. These graphical plot sections 906, 908, 910, and 912 show the baseline signal, which exhibits a drift. Plot section 914 corresponds to repetitive pressing of a digit (e.g., a finger) on the sense region, wherein each valley 915 in the PMUT signal corresponds to one occurrence of the digit pressing at the sense region. In the example shown, plot section 914 shows 10 repetitions of the digit pressing at the sense region. After each repetition, the digit is completely released (removed) from the sense region. Plot section 916 also corresponds to repetitive pressing of the digit on the sense region, but after each repetition, the digit is not completely removed from the sense region. During the duration of plot section 916, the digit is in contact with the sense region. Plot section 918 corresponds to the digit touching the sense region and being held against the sense region continuously.

Figure 36:
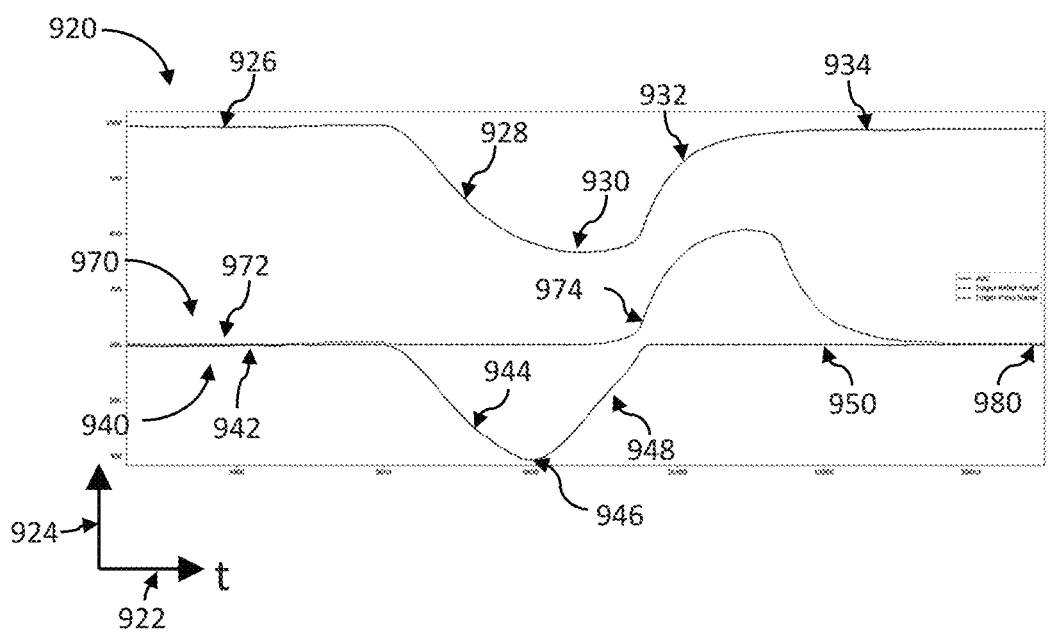
FIG. 36 is a diagram showing graphical plots of example PMUT digital data over a shorter time duration.

FIG. 36 shows graphical plots 920, 940, and 970 of illustrative PMUT digital data. The graphical plots have a horizontal axis 922 showing time t, in which 1 division corresponds to 200 ms, and a vertical axis 924 showing PMUT digital data. Graphical plot 920 is a graphical plot of PMUT digital data (e.g., data output from ADC 406 of FIG. 30, before additional processing) and corresponds to one occurrence of a digit pressing on the sense region and the digit being completely removed (released) from the sense region. Graphical plot 920 includes plot sections 926, 928, 930, 932, and 934 (ordered sequentially). Graphical plot sections 926 and 934 correspond to time periods during which there is nothing touching or coming into contact with the sense region. These graphical plot sections 926 and 934 show the baseline signal. During the duration of plot section 928, the PMUT digital signal is decreasing from the baseline (derivative of PMUT digital signal with respect to time is negative), approximately corresponding to the digit coming into contact with the sense region and the digit pressing at the sense region. The PMUT digital signal reaches a minimum at plot section 930. During the duration of plot section 932, the PMUT digital signal is increasing from the minimum (derivative of PMUT digital signal with respect to time is positive), approximately corresponding to the digit being released from the sense region.

The PMUT digital signal (920) can undergo additional processing. In the example shown in FIG. 36, there are two processed outputs (940, 970) from the PMUT digital signal. Plots 940, 970 show the PMUT digital signal 920 after passing through a high-pass filter as follows: plot 940 shows the high-pass filtered output that is less than or equal to 0 and plot 970 shows the high-pass filtered output that is greater than or equal to 0. The high-pass filter processing can be carried out on the output from the ADCs (e.g., ADC 406 of FIG. 29). In the example shown in FIG. 30, the high-pass filtering process is carried out at the MCU 410.

Graphical plot 940 (negative-side high-pass filtered PMUT digital signal) includes plot sections 942, 944, 946, 948, and 950, ordered sequentially. Plot sections 942 and 950 show the baseline signal. During the duration of plot section 944, the high-pass filtered PMUT digital signal (negative side) is decreasing from the baseline. The high-pass filtered PMUT digital signal (negative side) reaches a minimum at plot section 946. During the duration of plot section 948, the high-pass filtered PMUT digital signal (negative side) is increasing from the minimum. Plot sections 944, 946, and 948 can correspond to an object, such as a digit, touching and pressing at the sense region. Accordingly, the negative-side high-pass filtered PMUT digital signal is sometimes referred to as a press signal.

Graphical plot 970 (positive-side high-pass filtered PMUT digital signal) includes plot sections 972, 974, 976, 978, and 980, ordered sequentially. Plot sections 972 and 980 show the baseline signal. During the duration of plot section 974, the high-pass filtered PMUT digital signal (positive side) is increasing from the baseline. The high-pass filtered PMUT digital signal (positive side) reaches a maximum at plot section 976. During the duration of plot section 978, the high-pass filtered PMUT digital signal (positive side) is decreasing from the maximum. Plot sections 974, 976, and 978 can correspond to an object, such as a digit, being released from the sense region. Accordingly, the positive-side high-pass filtered PMUT digital signal is sometimes referred to as a release signal or relief signal. An end of the plot section 948, corresponding to the negative-side high-pass filtered PMUT digital data increasing toward the baseline, and a beginning of the plot section 974, corresponding to the positive-side high-pass filtered PMUT digital data increasing from the baseline, occur approximately concurrently.

Figure 37:
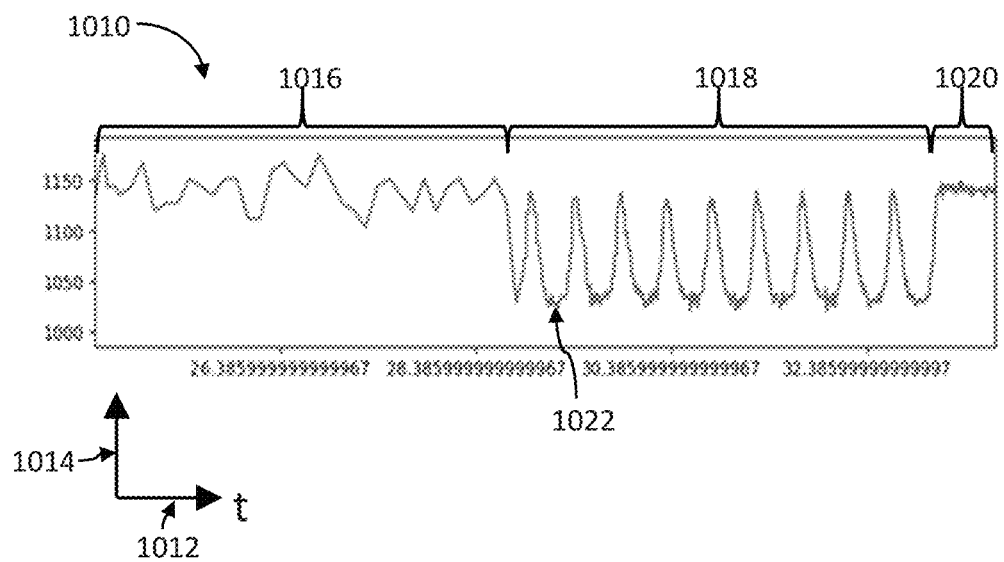
FIGS. 37 and 38 are diagrams showing graphical plots of PMUT digital data and PMFE digital data, respectively, in response to an example touch event.

FIG. 37 shows a graphical plot 1010 of illustrative PMUT digital data during a repetitive touch event. Graphical plot 1010 has a horizontal axis 1012 showing time t, in which 1 division corresponds to 2.0 sec, and a vertical axis 1014 showing PMUT digital data, after ADC and before high-pass filtering. Graphical plot 1010 includes plot sections 1016, 1018, and 1020 (ordered sequentially). Graphical plot portions 1016 and 1020 correspond to time periods during which there is nothing touching or coming into contact with the sense region. These graphical plot sections 1016 and 1020 show the baseline signal. Plot section 1018 corresponds to repetitive pressing of a digit (e.g., a finger) on the sense region, wherein each valley (minimum) 1022 in the PMUT signal corresponds to one occurrence of the digit pressing at the sense region. In the example shown, plot section 1018 shows 10 repetitions of the digit pressing at the sense region. After each repetition, the digit is completely released (removed) from the sense region. As shown in FIG. 37, the 10 repetitions of the digit pressing at the sense region occur during a time period of approximately 4.1 sec. Accordingly, the repetition rate is approximately 2.4 Hz.

Figure 38:
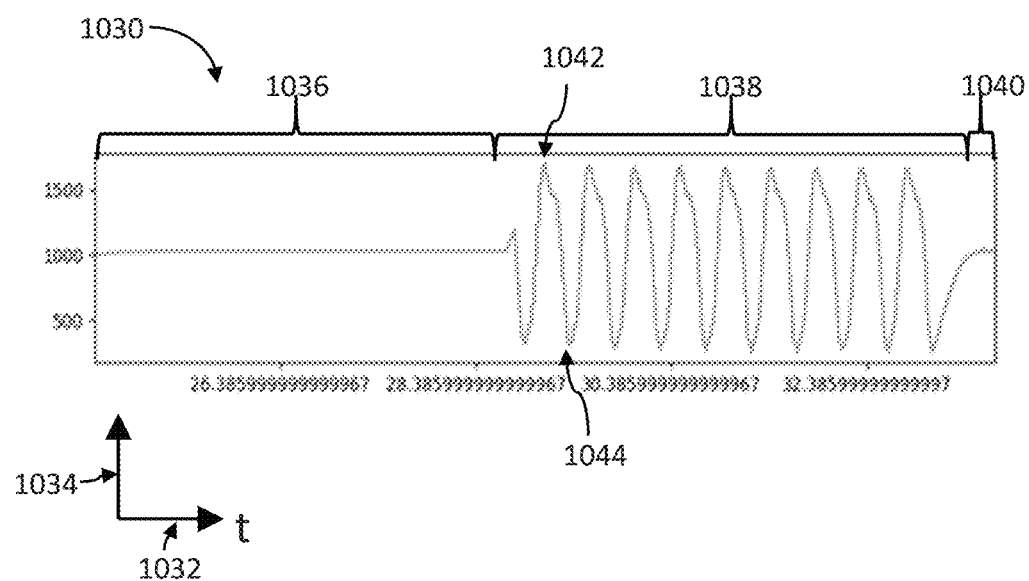

FIG. 38 shows a graphical plot 1030 of illustrative PMFE digital data during the repetitive touch event shown in FIG. 37. Graphical plot 1030 has a horizontal axis 1032 showing time t, in which 1 division corresponds to 2.0 sec, and a vertical axis 1034 showing PMFE digital data. Graphical plot 1030 includes plot sections 1036, 1038, and 1040 (ordered sequentially). Graphical plot portions 1036 and 1040 correspond to time periods during which there is nothing touching or coming into contact with the sense region. These graphical plot sections 1036 and 1040 show the baseline signal. Plot section 1038 corresponds to repetitive pressing of a digit (e.g., a finger) on the sense region, analogous to plot section 1018 of FIG. 37. There is a pair of maximum PMFE digital data 1042 and a minimum PMFE digital data 1044 (occurring after 1042) corresponding to one repetition of a digit pressing at the sense region and the digit being removed from the sense region. As the digit presses the sense region, the PMFE(s) undergo a first deformation resulting in a first PMFE signal, and as the digit is removed from the sense region, the PMFE(s) undergo a second deformation resulting in a second PMFE signal. In this case, the first and second deformations are in opposite directions and the first and second PMFE signals are of opposite polarities relative to the baseline signal. As illustrated in the example of FIG. 12, the first deformation can be a first deflection during which a first deflection voltage $V_{d1}$ (corresponding to strain of a certain polarity and magnitude) is detectable. The second deformation can be a second deflection during which a second deflection voltage $V_{d2}$ (corresponding to strain of a certain polarity and magnitude) is detectable. As shown in FIG. 38, the 10 repetitions of the digit pressing at the sense region occur during a time period of approximately 4.1 sec. Accordingly, the repetition rate is approximately 2.4 Hz.

What is claimed is:

1. A force-measuring and touch-sensing integrated circuit device, comprising:
  a semiconductor substrate;
  wiring on the semiconductor substrate;
  a thin-film piezoelectric stack overlying the semiconductor substrate and comprising a piezoelectric layer;
  at least one set of piezoelectric micromechanical force-measuring elements (PMFEs), each set comprising at least one PMFE; and
  an array of piezoelectric micromechanical ultrasonic transducers (PMUTs), each of the PMUTs being configured as a transmitter or a receiver;
  wherein the PMFEs and PMUTs are located at respective lateral positions along the thin-film piezoelectric stack, each of the PMFEs and PMUTs comprising a respective portion of the thin-film piezoelectric stack;
  the wiring extends from the semiconductor substrate to the PMUTs and to the PMFEs;
  each of the PMUTs comprises: (1) a cavity, (2) the respective portion of the thin-film piezoelectric stack overlying the cavity, (3) a first PMUT electrode, and (4) a second PMUT electrode, the first PMUT electrode and the second PMUT electrode being positioned on opposite sides of the piezoelectric layer to constitute a piezoelectric capacitor, the PMUTs being coupled to the wiring, the cavity being positioned between the thin-film piezoelectric stack and the semiconductor substrate;
  the PMUTs comprise: (1) first transmitters configured to transmit, upon application of voltage signals between the respective first PMUT electrode and the respective second PMUT electrode, ultrasound signals of a first frequency $F_1$, in longitudinal mode(s) propagating along a normal direction approximately normal to the piezoelectric layer and away from the cavities, and (2) first receivers configured to output, in response to ultrasound signals of the first frequency $F_1$ arriving along the normal direction, voltage signals between the respective first PMUT electrode and the respective second PMUT electrode;
  each of the PMFEs comprises: (1) a first PMFE electrode, electrode, and (3) the respective portion of the thin-film piezoelectric stack, the first PMFE electrode and the second PMFE electrode being positioned on opposite sides of the piezoelectric layer to constitute a piezoelectric capacitor, the PMFEs being coupled to the wiring; and
  each of the PMFEs is configured to output voltage signals between the respective first PMFE electrode and the respective second PMFE electrode in accordance with a time-varying strain at the respective portion of the piezoelectric layer between the respective first PMFE electrode and the respective second PMFE electrode resulting from a low-frequency mechanical deformation.

2. The force-measuring and touch-sensing integrated circuit device of claim 1, wherein the respective portions of the thin-film piezoelectric stack of the first receivers oscillate at the first frequency $F_1$ in response to ultrasound signals of the first frequency $F_1$ arriving along the normal direction.

3. The force-measuring and touch-sensing integrated circuit device of claim 1, wherein the low-frequency mechanical deformation is induced by an excitation having a repetition rate of 100 Hz or less.

4. The force-measuring and touch-sensing integrated circuit device of claim 3, wherein the repetition rate is 10 Hz or less.

5. The force-measuring and touch-sensing integrated circuit device of claim 1, wherein the low-frequency mechanical deformation is induced by one or more of the following: touching, pressing, bending, twisting, typing, tapping, and pinching.

6. The force-measuring and touch-sensing integrated circuit device of claim 1, wherein the low-frequency mechanical deformation comprises a deformation of an entirety of the force-measuring and touch-sensing integrated circuit device.

7. The force-measuring and touch-sensing integrated circuit device of claim 1, wherein the low-frequency mechanical deformation comprises a compression and expansion of the piezoelectric layer along the normal direction.

8. The force-measuring and touch-sensing integrated circuit device of claim 1, wherein the low-frequency mechanical deformation comprises elastic wave oscillations.

9. The force-measuring and touch-sensing integrated circuit device of claim 1, wherein the low-frequency mechanical deformation comprises expansion and/or compression of the piezoelectric layer along a lateral direction approximately parallel to the piezoelectric layer.

10. The force-measuring and touch-sensing integrated circuit device of claim 1, wherein the thin-film piezoelectric stack additionally comprises a mechanical layer coupled to the piezoelectric layer.

11. The force-measuring and touch-sensing integrated circuit device of claim 10, wherein the mechanical layer comprises silicon, silicon oxide, silicon nitride, aluminum nitride, or a material that is included in the piezoelectric layer.

12. The force-measuring and touch-sensing integrated circuit device of claim 1, wherein the piezoelectric layer comprises aluminum nitride, scandium-doped aluminum nitride, polyvinylidene fluoride (PVDF), lead zirconate titanate (PZT), $K_xNa_{1-x}NbO_3$ (KNN), quartz, zinc oxide, or lithium niobate.

13. The force-measuring and touch-sensing integrated circuit device of claim 1, wherein for at least one of the PMUTs, a region of overlap of the respective first PMUT electrode and the respective second PMUT electrode is circular.

14. The force-measuring and touch-sensing integrated circuit device of claim 1, wherein each PMFE has lateral dimensions no greater than 2.5 mm by 2.5 mm.

15. The force-measuring and touch-sensing integrated circuit device of claim 1, wherein the first receivers number less than the first transmitters.

16. The force-measuring and touch-sensing integrated circuit device of claim 1, wherein more than half of the first receivers are approximately equidistant from a central point of the PMUT array.

17. The force-measuring and touch-sensing integrated circuit device of claim 1, wherein the first frequency $F_1$ is in a range of 0.1 MHz to 25 MHz.

18. The force-measuring and touch-sensing integrated circuit device of claim 1, wherein the semiconductor substrate additionally comprises signal processing circuitry coupled to the PMUTs and the PMFEs via the wiring.

19. The force-measuring and touch-sensing integrated circuit device of claim 18, wherein the signal processing circuitry comprises a high-voltage transceiver circuitry configured to output voltage pulses of 5 V or greater, the high-voltage transceiver circuitry being connected to the first PMUT electrodes and the second PMUT electrodes of the PMUTs that are configured as transmitters.

20. The force-measuring and touch-sensing integrated circuit device of claim 18, wherein the signal processing circuitry comprises analog-to-digital converter circuitry for converting the PMUT voltage signals to PMUT digital data and for converting the PMFE voltage signals to PMFE digital data.

21. The force-measuring and touch-sensing integrated circuit device of claim 1, having lateral dimensions no greater than 10 mm by 10 mm.

22. The force-measuring and touch-sensing integrated circuit device of claim 1, wherein the PMUTs are arranged in a PMUT array and the PMUT array has a square or rectangular outer perimeter.

23. The force-measuring and touch-sensing integrated circuit device of claim 1, wherein the PMUTs additionally comprise:
    second transmitters configured to transmit, upon application of voltage signals between the respective first PMUT electrode and the respective second PMUT electrode, ultrasound signals of a second frequency $F_2$, in longitudinal mode(s) propagating along the normal direction and away from the cavities; and
    second receivers configured to output, in response to ultrasound signals of the second frequency $F_2$ arriving along the normal direction, voltage signals between the respective first PMUT electrode and the respective second PMUT electrode.

24. The force-measuring and touch-sensing integrated circuit device of claim 23, wherein the second receivers number less than the second transmitters.

25. The force-measuring and touch-sensing integrated circuit device of claim 23, wherein the PMUTs are arranged in a PMUT array and more than half of the second receivers are approximately equidistant from a central point of the PMUT array.

26. The force-measuring and touch-sensing integrated circuit device of claim 23, wherein the second frequency $F_2$ is in a range of 0.1 MHz to 25 MHz.

27. The force-measuring and touch-sensing integrated circuit device of claim 23, wherein the PMUTs are arranged in a PMUT array and the second receivers are, on average, closer than the first receivers to a central point of the PMUT array.

28. The force-measuring and touch-sensing integrated circuit device of claim 1, wherein the at least one set of piezoelectric micromechanical force-measuring elements (PMFEs) is a plurality of PMFE sets, the PMFE sets being arranged in an array.

29. The force-measuring and touch-sensing integrated circuit device of claim 28, wherein the PMFE array is two-dimensional.

30. The force-measuring and touch-sensing integrated circuit device of claim 29, wherein the PMUTs are arranged in a PMUT array and the PMFE array has an opening in which the PMUT array is disposed.

31. The force-measuring and touch-sensing integrated circuit device of claim 1, wherein each PMFE set comprises a plurality of PMFEs connected in series, outermost electrodes of the first PMFE electrodes and the second PMFE electrodes of the PMFEs in the series being connected as differential inputs to an amplifier circuitry.

32. The force-measuring and touch-sensing integrated circuit device of claim 31, wherein a node between two adjacent PMFEs in the series is a common node.

33. The force-measuring and touch-sensing integrated circuit device of claim 31, wherein each PMFE set comprises two PMFEs connected in series and a node between the two PMFEs is a common node.

34. The force-measuring and touch-sensing integrated circuit device of claim 1, wherein:
    each of the PMUTs has an inflection line in the respective portion of the thin-film piezoelectric stack; and
    for at least one of the PMUTs, the respective first PMUT electrode and the respective second PMUT electrode are located inside the respective inflection line.

35. The force-measuring and touch-sensing integrated circuit device of claim 34, wherein:
    the at least one of the PMUTs comprises at least one release hole overlapping the respective inflection line, extending through the respective portion of the thin-film piezoelectric stack, and connecting to the respective cavity; and
    the at least one release hole does not extend through the respective first PMUT electrode and the respective second PMUT electrode.

36. The force-measuring and touch-sensing integrated circuit device of claim 35, wherein:
    the at least one release hole does not extend through wiring connected to the respective first PMUT electrode and/or the respective second PMUT electrode.

37. The force-measuring and touch-sensing integrated circuit device of claim 34, wherein:
    the at least one of the PMUTs additionally comprises a first outer PMUT electrode and a second outer PMUT electrode, the first outer PMUT electrode and the second PMUT electrode being positioned on opposite sides of the piezoelectric layer to constitute an outer piezoelectric capacitor; and
    the first outer PMUT electrode and the second outer PMUT electrode are located outside the respective inflection line.

38. The force-measuring and touch-sensing integrated circuit device of claim 37, wherein the at least one of the PMUTs is configured as a receiver.

39. The force-measuring and touch-sensing integrated circuit device of claim 37, wherein:
    the at least one of the PMUTs comprises at least one release hole overlapping the respective inflection line, extending through the respective portion of the thin-film piezoelectric stack, and connecting to the respective cavity; and
    the at least one release hole does not extend through any of the following: the respective first PMUT electrode, the respective second PMUT electrode, the respective first outer PMUT electrode, and the respective second outer PMUT electrode.

40. The force-measuring and touch-sensing integrated circuit device of claim 39, wherein:
    the at least one of the PMUTs comprises a first wiring corridor and a second wiring corridor perpendicular to the first wiring corridor, the first wiring corridor and the second wiring corridor traversing the respective inflection line;
wiring connected to the respective first PMUT electrode and the respective second PMUT electrode of the at least one of the PMUTs is contained in the first wiring corridor and the second wiring corridor; and
the at least one release hole does not overlap the first wiring corridor and the second wiring corridor.

41. The force-measuring and touch-sensing integrated circuit device of claim 37, wherein:
the at least one of the PMUTs comprises a first wiring corridor, traversing the respective inflection line;
wiring connected to the respective first PMUT electrode and/or the respective second PMUT electrode of the at least one of the PMUTs is contained in the first wiring corridor; and
the respective first outer PMUT electrode and the respective second outer PMUT electrode of the at least one of the PMUTs do not overlap the first wiring corridor.

42. The force-measuring and touch-sensing integrated circuit device of claim 41, wherein:
for the at least one of the PMUTs, a region of overlap of the respective first outer PMUT electrode and the respective second outer PMUT electrode is a C-shaped ring.

43. The force-measuring and touch-sensing integrated circuit device of claim 37, wherein the at least one of the PMUTs comprises the respective piezoelectric capacitor and the respective outer piezoelectric capacitor connected in series, outermost electrodes of the respective first PMUT electrode, the respective second PMUT electrode, the respective first outer PMUT electrode, and the respective second outer PMUT electrode being connected as differential inputs to an amplifier circuitry.

44. The force-measuring and touch-sensing integrated circuit device of claim 43, wherein a node between the respective piezoelectric capacitor and the respective outer piezoelectric capacitor in the series is a common node.

45. An apparatus, comprising:
a cover layer having an outer surface which can be touched by a digit and an inner surface opposite the outer surface; and
at least one force-measuring and touch-sensing integrated circuit device coupled to the inner surface;
wherein the at least one force-measuring and touch-sensing integrated circuit device comprises:
a semiconductor substrate;
wiring on the semiconductor substrate;
a thin-film piezoelectric stack overlying the semiconductor substrate and comprising a piezoelectric layer;
at least one set of piezoelectric micromechanical force-measuring elements (PMFEs), each set comprising at least one PMFE; and
an array of piezoelectric micromechanical ultrasonic transducers (PMUTs), each of the PMUTs being configured as a transmitter or a receiver;
wherein the PMFEs and PMUTs are located at respective lateral positions along the thin-film piezoelectric stack, each of the PMFEs and PMUTs comprising a respective portion of the thin-film piezoelectric stack;
the wiring extends from the semiconductor substrate to the PMUTs and to the PMFEs;
each of the PMUTs comprises: (1) a cavity, (2) the respective portion of the thin-film piezoelectric stack overlying the cavity, (3) a first PMUT electrode, and (4) a second PMUT electrode, the first PMUT electrode and the second PMUT electrode being positioned on opposite sides of the piezoelectric layer to constitute a piezoelectric capacitor, the PMUTs being coupled to the wiring, the cavity being positioned between the thin-film piezoelectric stack and the semiconductor substrate;
the PMUTs comprise: (1) first transmitters configured to transmit, upon application of voltage signals between the respective first PMUT electrode and the respective second PMUT electrode, ultrasound signals of a first frequency $F_1$, in longitudinal mode(s) propagating along a normal direction approximately normal to the piezoelectric layer away from the cavities and towards a sense region of the outer surface, and (2) first receivers configured to output, in response to ultrasound signals of the first frequency $F_1$ arriving along the normal direction, voltage signals between the respective first PMUT electrode and the respective second PMUT electrode;
each of the PMFEs comprises: (1) a first PMFE electrode, (2) a second PMFE electrode, and (3) the respective portion of the thin-film piezoelectric stack, the first PMFE electrode and the second PMFE electrode being positioned on opposite sides of the piezoelectric layer to constitute a piezoelectric capacitor, the PMFEs being coupled to the wiring; and
each of the PMFEs is configured to output voltage signals between the respective first PMFE electrode and the respective second PMFE electrode in accordance with a time-varying strain at the respective portion of the piezoelectric layer between the respective first PMFE electrode and the respective second PMFE electrode resulting from a low-frequency mechanical deformation.

46. The apparatus of claim 45, wherein the cover layer comprises a material selected from the following: wood, glass, metal, plastic, leather, fabric, and ceramic.

47. The apparatus of claim 45, wherein the low-frequency mechanical deformation is induced by an excitation having a repetition rate of 100 Hz or less.

48. The apparatus of claim 47, wherein the repetition rate is 10 Hz or less.

49. The apparatus of claim 47, wherein the excitation occurs at the outer surface of the cover layer.

50. The apparatus of claim 47, wherein the excitation occurs at a portion of the apparatus mechanically coupled to the cover layer.

51. The apparatus of claim 45, wherein the low-frequency mechanical deformation is induced by one or more of the following: touching, pressing, bending, twisting, typing, tapping, and pinching.

52. The apparatus of claim 45, wherein the low-frequency mechanical deformation comprises a deformation of an entirety of the force-measuring and touch-sensing integrated circuit device.

53. The apparatus of claim 45, wherein the low-frequency mechanical deformation comprises a compression and expansion of the piezoelectric layer along the normal direction.

54. The apparatus of claim 45, wherein the low-frequency mechanical deformation comprises elastic wave oscillations.

55. The apparatus of claim 45, wherein the low-frequency mechanical deformation comprises expansion and/or compression of the piezoelectric layer along a lateral direction approximately parallel to the piezoelectric layer.

56. The apparatus of claim 45, wherein the low-frequency mechanical deformation comprises a deflection of the cover layer.

57. The apparatus of claim 45, wherein the semiconductor substrate additionally comprises signal processing circuitry coupled to the PMUTs and the PMFEs via the wiring.

* * * * *